(12) United States Patent
Kubota

(10) Patent No.: US 10,416,227 B2
(45) Date of Patent: Sep. 17, 2019

(54) METHOD OF FABRICATING SURFACE-EMITTING LASER

(71) Applicant: SUMITOMO ELECTRIC INDUSTRIES, LTD., Osaka (JP)

(72) Inventor: Ryosuke Kubota, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 41 days.

(21) Appl. No.: 15/934,359

(22) Filed: Mar. 23, 2018

(65) Prior Publication Data
US 2018/0356459 A1 Dec. 13, 2018

(30) Foreign Application Priority Data
Jun. 7, 2017 (JP) .................................. 2017-112697

(51) Int. Cl.
| | | |
|---|---|---|
| G01R 31/28 | (2006.01) | |
| H01S 5/00 | (2006.01) | |
| G01R 31/27 | (2006.01) | |
| H01S 5/42 | (2006.01) | |
| H01S 5/022 | (2006.01) | |
| H01S 5/042 | (2006.01) | |

(52) U.S. Cl.
CPC ....... *G01R 31/2863* (2013.01); *G01R 31/275* (2013.01); *G01R 31/2872* (2013.01); *H01S 5/0021* (2013.01); *H01S 5/0042* (2013.01); *H01S 5/423* (2013.01); *H01S 5/02276* (2013.01); *H01S 5/0425* (2013.01); *H01S 2301/176* (2013.01)

(58) Field of Classification Search
CPC ............ G01R 31/2863; G01R 31/2872; G01R 31/275; H01S 2301/176; H01S 5/0425; H01S 5/02276; H01S 5/423; H01S 5/0042; H01S 5/0021

USPC .................................................... 324/750.05
See application file for complete search history.

(56) References Cited

U.S. PATENT DOCUMENTS

2002/0034888 A1* 3/2002 Edwards .............. G01R 1/0408
439/71
2006/0110110 A1* 5/2006 Yi .......................... G02B 6/421
385/93

FOREIGN PATENT DOCUMENTS

JP 2005-510044 4/2005
WO 03/017326 8/2002

* cited by examiner

*Primary Examiner* — Melissa J Koval
*Assistant Examiner* — Trung Q. Nguyen
(74) *Attorney, Agent, or Firm* — Smith, Gambrell & Russell, LLP

(57) ABSTRACT

A method of fabricating a surface-emitting laser includes the steps of fabricating a substrate product including device sections, a pad electrode, and a conductor, each of the device sections including a surface-emitting laser having an electrode, the conductor connecting the pad electrode to the electrode across a boundary of the device sections; attaching a connection device to the substrate product, the connection device including a probe device having a probe and a probe support base having an opening; performing a burn-in test of the surface-emitting lasers by applying electric power to the pad electrode through the probe at a high temperature; and after the burn-in test, separating the substrate product into semiconductor chips. The burn-in test includes a step of monitoring light emitted by the surface-emitting laser through the opening during the burn-in test, and a step of selecting the surface-emitting lasers based on a monitoring result.

7 Claims, 16 Drawing Sheets

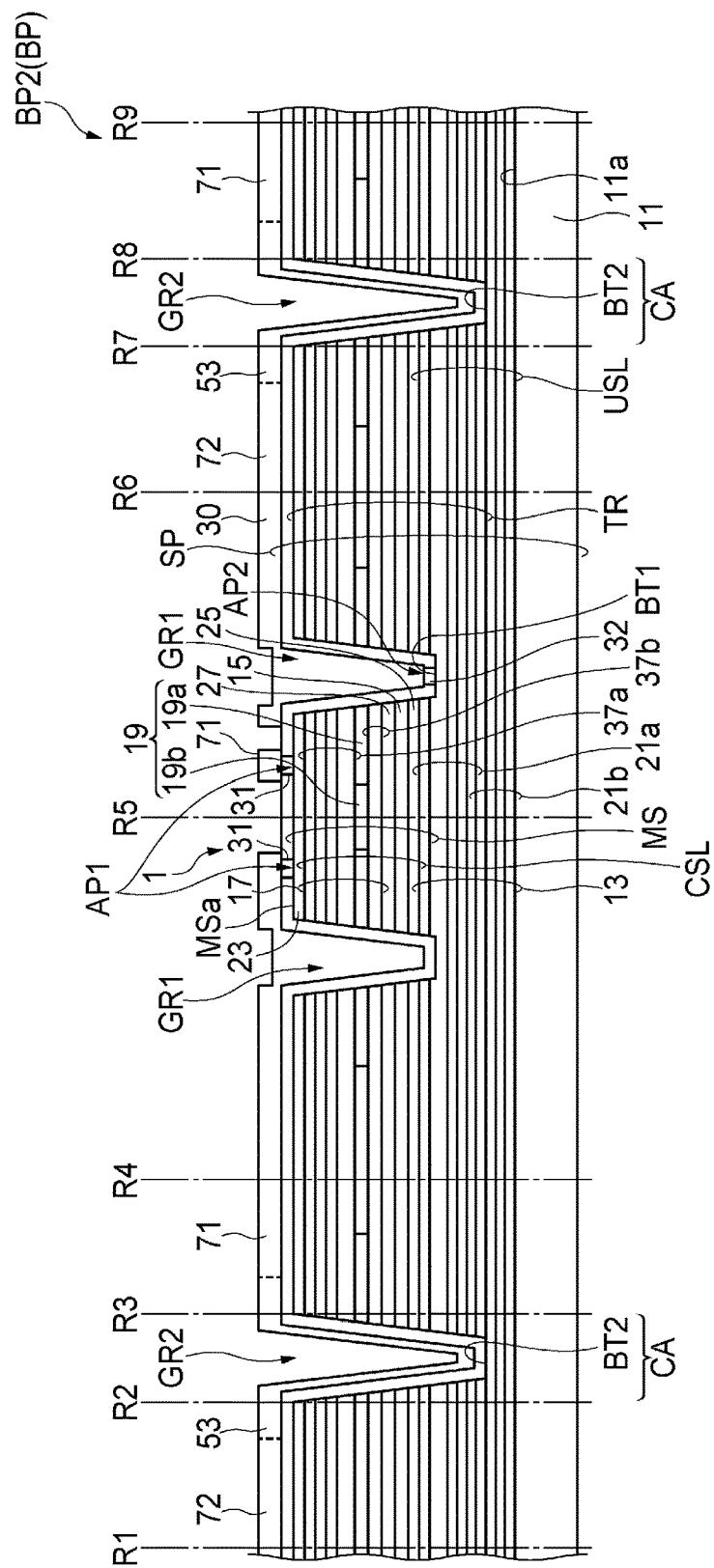

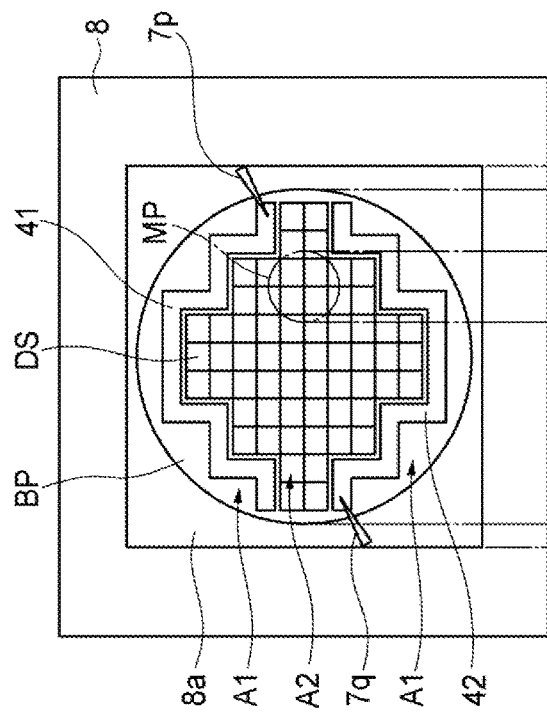
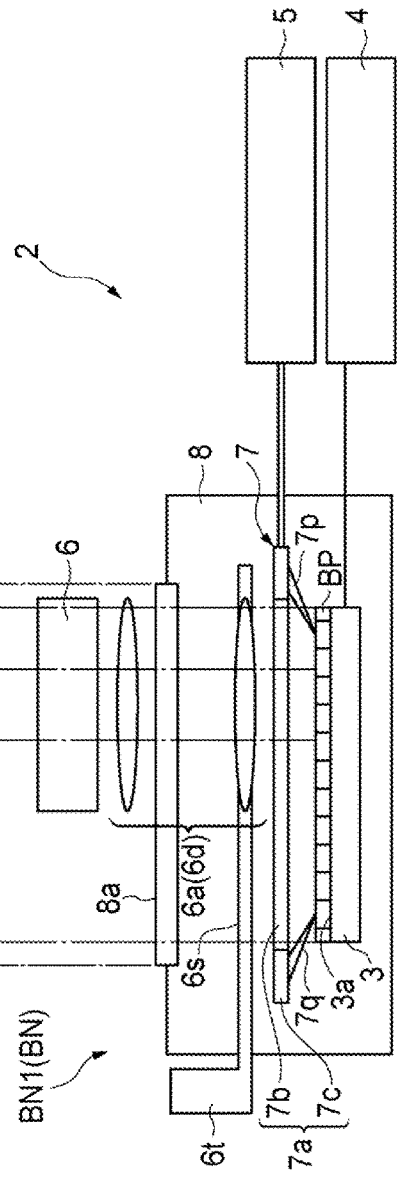
FIG. 8B
FIG. 8A

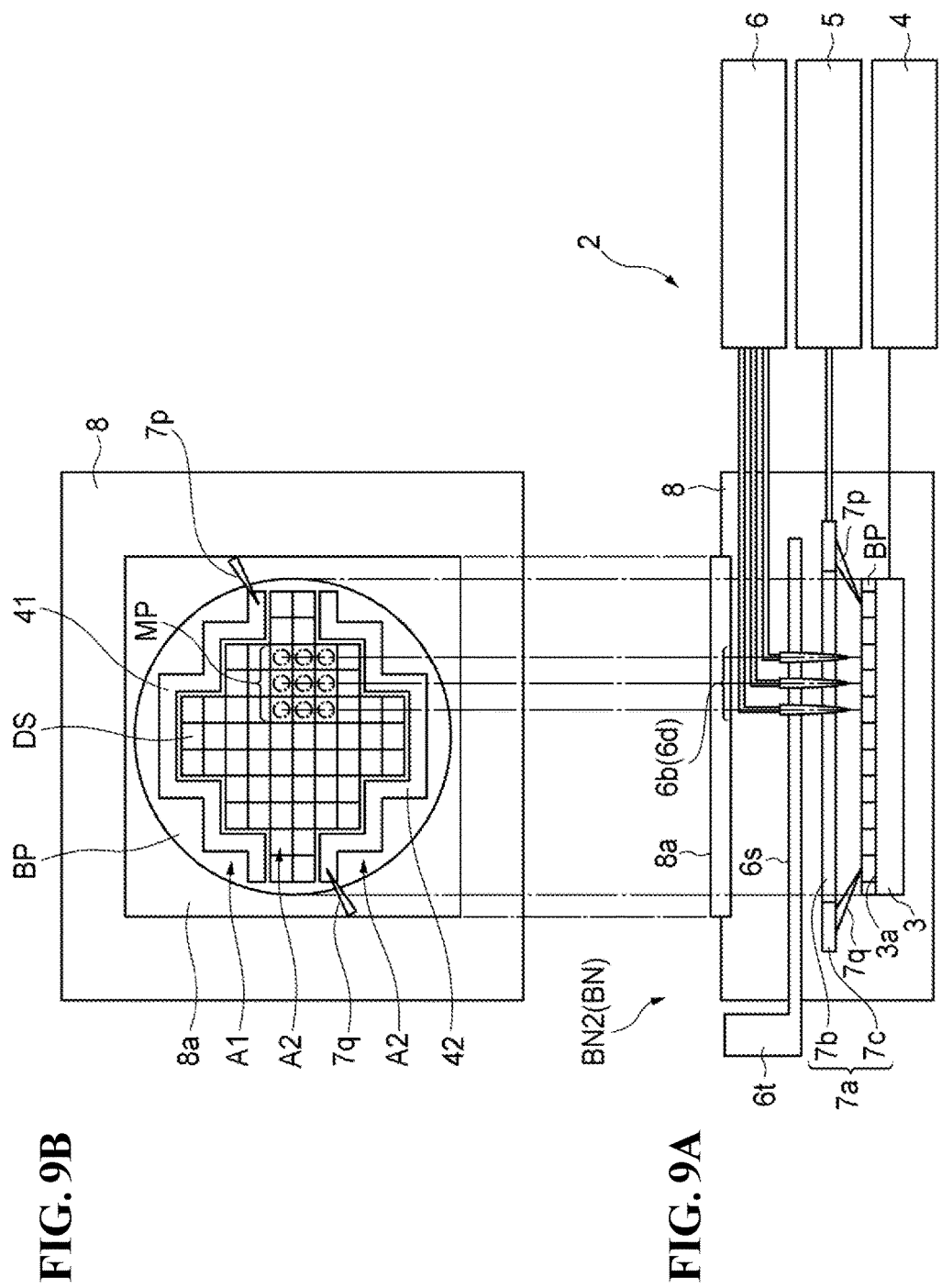

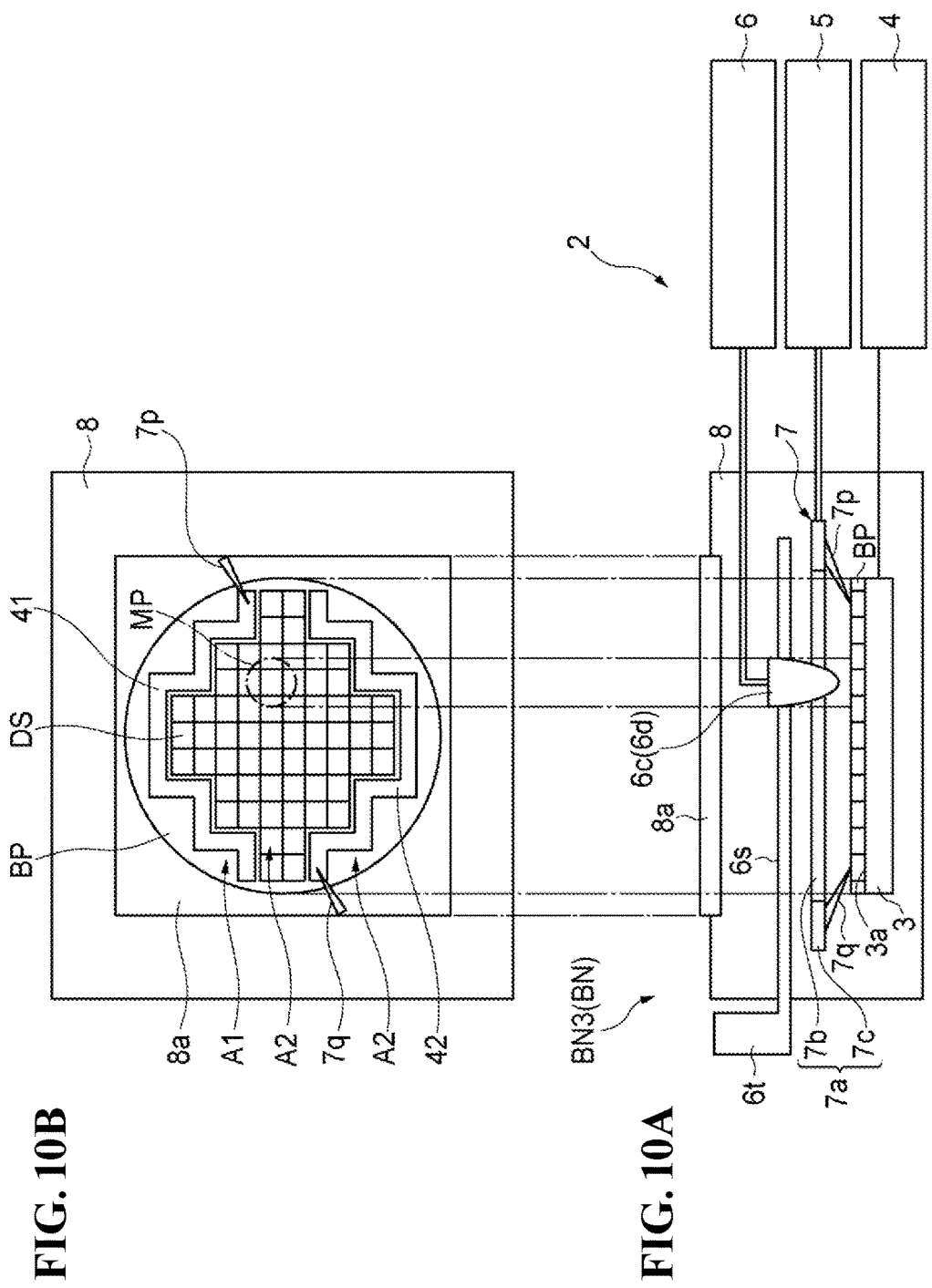

ically,
METHOD OF FABRICATING SURFACE-EMITTING LASER

BACKGROUND OF THE INVENTION

1. Field of the Invention

The present invention relates to a method of fabricating a surface-emitting laser.

2. Description of the Related Art

Japanese Unexamined Patent Application Publication (Translation of PCT Application) No. 2005-510044 discloses a method of executing a wafer level burn-in test on electronic devices.

SUMMARY OF THE INVENTION

In the method that executes an electrical inspection on electronic devices disclosed in Japanese Unexamined Patent Application Publication (Translation of PCT Application) No. 2005-510044, a contact plate is used for inspecting a plurality of semiconductor devices arrayed on a wafer. The contact plate is placed on the wafer so as to physically contact individual electric contacts on the semiconductor devices. Electric power is supplied to the semiconductor devices on the wafer by using the contact plate.

Before a semiconductor light-emitting device such as a surface-emitting laser is assembled, a burn-in test and an optical inspection are executed on the semiconductor light-emitting device. In this optical inspection, it is required to supply electric power to surface-emitting lasers arrayed on a wafer and to receive light emitted from the surface-emitting lasers. The surface-emitting lasers emit light in a direction perpendicular to a principal surface of the wafer. When the contact plate disclosed in Japanese Unexamined Patent Application Publication (Translation of PCT Application) No. 2005-510044 is used to supply electric power to the surface-emitting lasers, the contact plate is arranged to cover the surface-emitting lasers. Hence, the contact plate disturbs the optical inspection on the surface-emitting lasers.

A method of fabricating a surface-emitting laser according to an aspect of the present invention includes the steps of fabricating a substrate product having a first area and a second area provided at a side of the first area, the substrate product including a plurality of device sections provided in the first area, a pad electrode provided in the second area, and a conductor, each of the device sections including a surface-emitting laser having an electrode, the conductor connecting the pad electrode to the electrode of the surface-emitting laser across a boundary of the device sections; attaching a connection device to the substrate product, the connection device including a probe device, the probe device having a probe and a probe support base supporting the probe, the probe support base having an opening; performing a burn-in test of the surface-emitting lasers in the device sections by applying electric power to the pad electrode of the substrate product through the probe that is contacted to the pad electrode at a temperature higher than a room temperature; and after the burn-in test of the surface-emitting lasers, separating the substrate product into a plurality of semiconductor chips each of which includes one of the surface-emitting lasers. The step of performing the burn-in test includes a step of monitoring light emitted by the surface-emitting laser in at least one of the device sections through the opening of the probe support base during the burn-in test so as to obtain a monitoring result, and a step of selecting the surface-emitting lasers based on the monitoring result.

The above-described object and other objects, features, and advantages according to embodiments of the present invention will be more easily understood from the following detailed description on preferred embodiments according to the present invention with reference to the accompanying drawings.

BRIEF DESCRIPTION OF THE DRAWINGS

FIG. 7 is a cross-sectional view taken along line R1-R9 illustrated in FIG. 6.

FIGS. 8A and 8B schematically illustrate a connection device for optical measurement according to a first mode.

FIGS. 9A and 9B schematically illustrate a connection device for optical measurement according to a second mode.

FIGS. 10A and 10B schematically illustrate a connection device for optical measurement according to a third mode.

DESCRIPTION OF THE PREFERRED EMBODIMENTS

Figure 1:
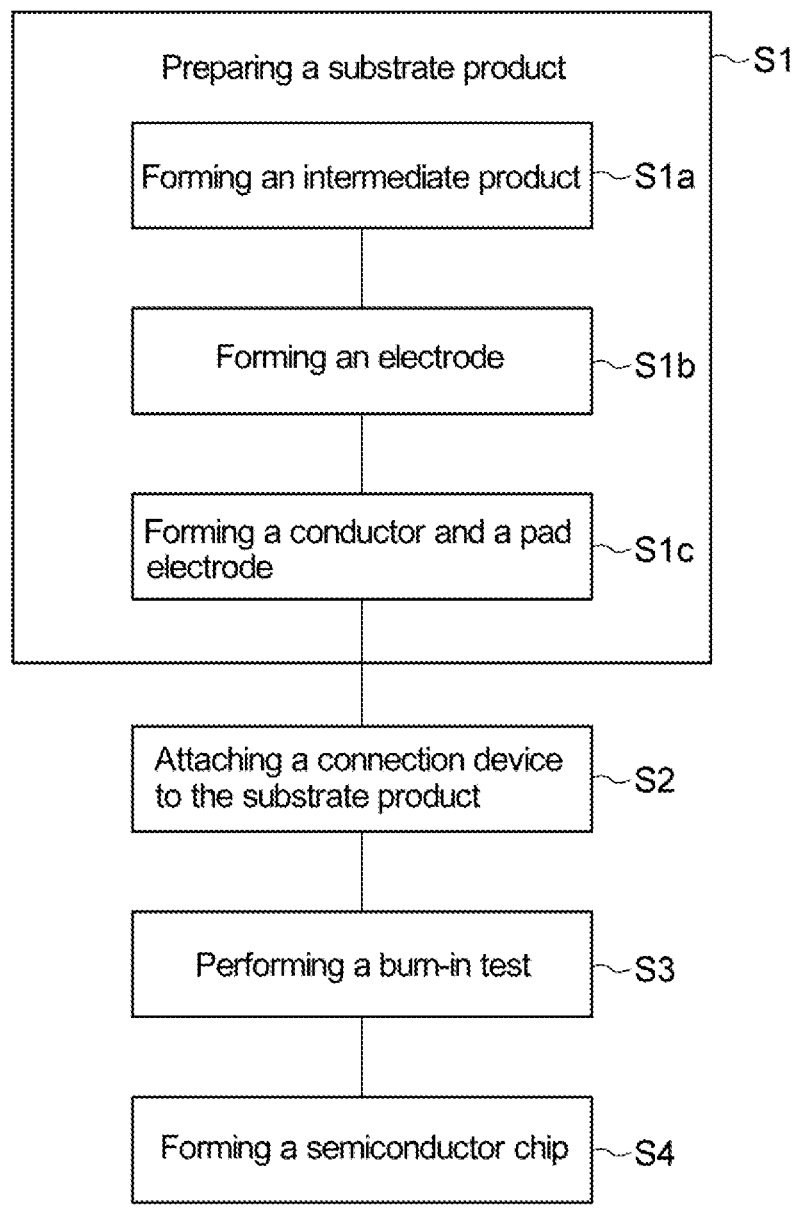
FIG. 1 is a flowchart illustrating a method of fabricating a surface-emitting laser according to an embodiment.

Specific embodiments will be described below.

A method of fabricating a surface-emitting laser according to an embodiment includes the steps of (a) fabricating a substrate product having a first area and a second area provided at a side of the first area, the substrate product including a plurality of device sections provided in the first area, a pad electrode provided in the second area, and a conductor, each of the device sections including a surface-emitting laser having an electrode, the conductor connecting the pad electrode to the electrode of the surface-emitting laser across a boundary of the device sections; (b) attaching a connection device to the substrate product, the connection device including a probe device, the probe device having a probe and a probe support base supporting the probe, the probe support base having an opening; (c) performing a burn-in test of the surface-emitting lasers in the device sections by applying electric power to the pad electrode of the substrate product through the probe that is contacted to the pad electrode at a temperature higher than a room temperature; and (d) after the burn-in test of the surface-emitting lasers, separating the substrate product into a plurality of semiconductor chips each of which includes one of the surface-emitting lasers. The step of performing the burn-in test includes a step of monitoring light emitted by the surface-emitting laser in at least one of the device sections through the opening of the probe support base during the burn-in test so as to obtain a monitoring result, and a step of selecting the surface-emitting lasers based on the monitoring result.

According to the method of fabricating the surface-emitting laser, electric power may be applied to the surface-emitting lasers in the device sections of the substrate product by using the pad electrode provided in the second area different from the first area having the array of the device sections. Also, a device for monitoring light emitted by the surface-emitting laser in the device section of the substrate product may be disposed above the first area of the substrate product. Accordingly, light emitted by the surface-emitting laser in the device section can be monitored through the opening of the probe support base during the burn-in test while electric power is supplied to the substrate product. In the burn-in test, the substrate product is placed on an inspection stage at a temperature higher than a room temperature. By using the monitoring results of the burn-in test, semiconductor chips including surface-emitting lasers having desirable characteristics may be provided.

In the method of fabricating the surface-emitting laser according to an embodiment, preferably, the connection device includes an optical window and a light receiving device. In the step of performing the burn-in test, the light receiving device is aligned on part of the device sections so as to receive light emitted by at least one of the surface-emitting lasers through the optical window.

In the method of fabricating the surface-emitting laser according to an embodiment, preferably, the substrate product has an insulating layer provided in the first area and the second area. The pad electrode is provided on the insulating layer.

In the method of fabricating the surface-emitting laser according to an embodiment, preferably, each of the surface-emitting lasers in the device sections has a pair of electrodes. The substrate product includes first and second pad electrodes provided in the second area, a first conductor that connects the first pad electrode to one of the pair of electrodes of the surface-emitting laser in a first device section of the device sections across a boundary of the device sections, a second conductor that connects the second pad electrode to one of the pair of electrodes of the surface-emitting laser in a second device section of the device sections across a boundary of the device sections, and a third conductor that connects one of the pair of electrodes of the surface-emitting laser in a third device section of the device sections to one of the pair of electrodes of the surface-emitting laser in a fourth device section of the device sections across a boundary of the device sections.

The method of fabricating the surface-emitting laser according to an embodiment may further include a step of forming a passivation film on the substrate product between the step of performing a burn-in test of the surface-emitting lasers and the step of separating the substrate product into the plurality of semiconductor chips. The substrate product has an insulating layer provided in the first area and the second area. The pad electrode is provided on the insulating layer. In addition, the passivation film has an opening located above the electrode of the surface-emitting laser in each of the device sections.

According to the method of fabricating the surface-emitting laser, the passivation film may protect the surface-emitting laser.

The method of fabricating the surface-emitting laser according to an embodiment may further include a step of removing the insulating layer and the passivation film from a separation area included in the first area of the substrate product before the step of separating the substrate product into the plurality of semiconductor chips. The separation area is arranged to surround each of the device sections.

According to the method of fabricating the surface-emitting laser, before the separation of the substrate product into the semiconductor chips, the insulating layer and the passivation film may be removed from the separation area so as to separate the substrate product easily at the separation area.

The method of fabricating the surface-emitting laser according to an embodiment may further include a step of removing at least part of the conductor so as to separate the electrode of the surface-emitting laser from the pad electrode between the step of performing a burn-in test of the surface-emitting lasers and the step of separating the substrate product into the plurality of semiconductor chips.

According to the method of fabricating the surface-emitting laser, before the separation of the substrate product into the semiconductor chips, the conductor in the separation area are removed. The conductor connected to the electrode of the surface-emitting laser does not remain around an edge of the semiconductor chip.

The findings according to the present invention can be easily understood with regard to the detailed description given below with reference to the exemplarily presented accompanying drawings. Now a method of fabricating a surface-emitting laser according to an embodiment is described with reference to the accompanying drawings. The same reference sign is applied to the same part if possible.

A method of fabricating a surface-emitting laser is described with reference to FIGS. 1 to 16.

In step S1, a substrate product BP is prepared. In this embodiment, a substrate product BP is fabricated as a step of preparing a substrate product BP. Step S1 includes step S1a of forming an intermediate product SP, step S1b of forming an electrode on the intermediate product SP, and step S1c of forming a conductor and a pad electrode on the intermediate product SP. By the steps, the substrate product BP may be fabricated from the intermediate product SP.

Figure 2:
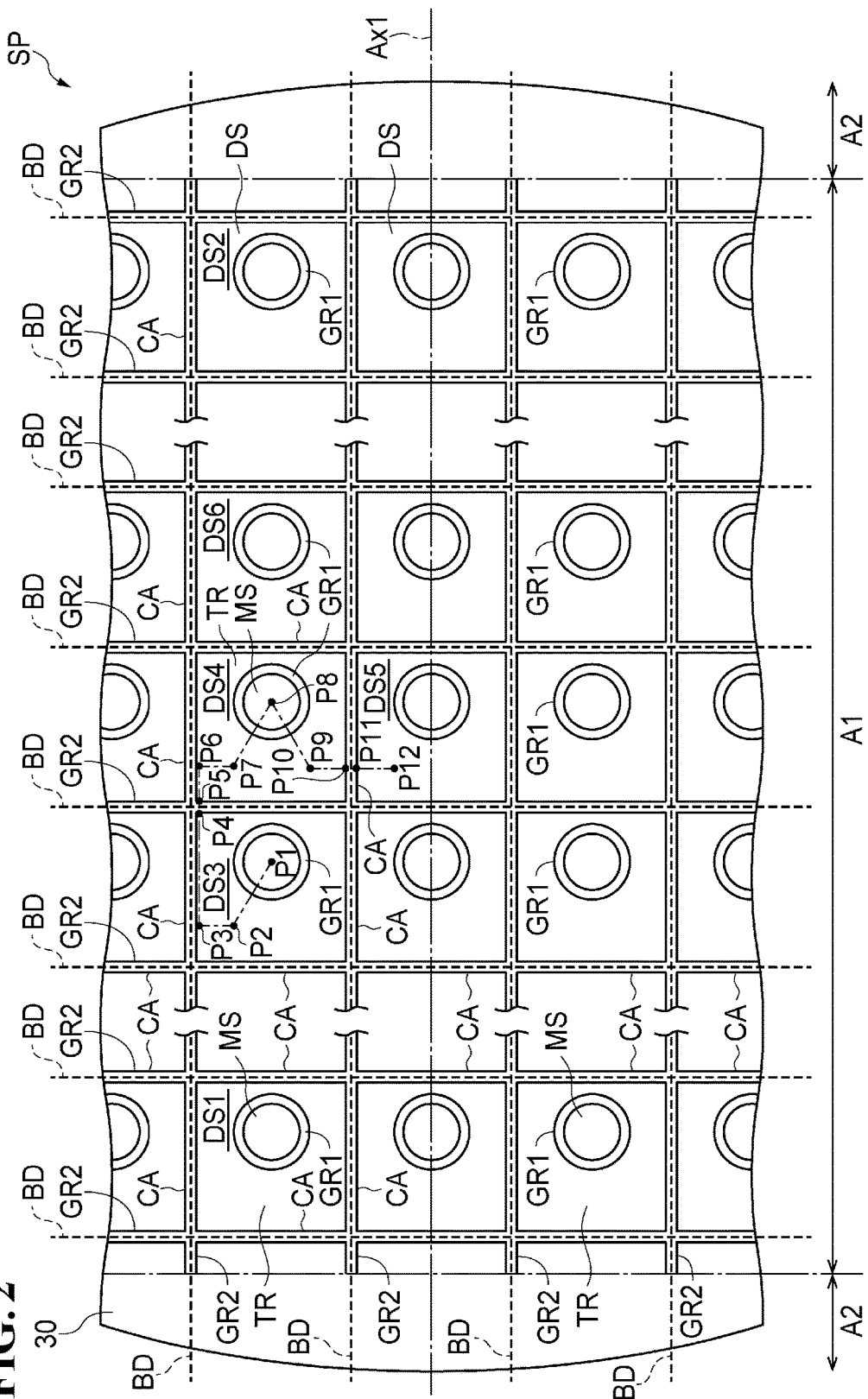
FIG. 2 is a plan view schematically illustrating an intermediate product in a step illustrated in FIG. 1 (step of forming intermediate product).
Figure 3A:
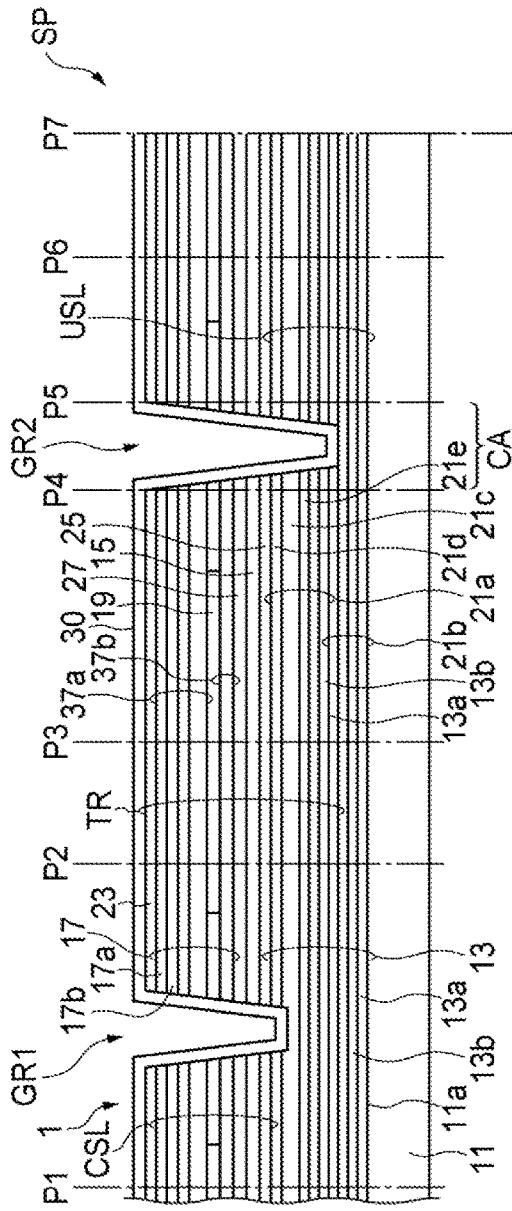
FIGS. 3A and 3B are cross-sectional views taken along line P1-P7 and line P7-P12 illustrated in FIG. 2.
Figure 3B:
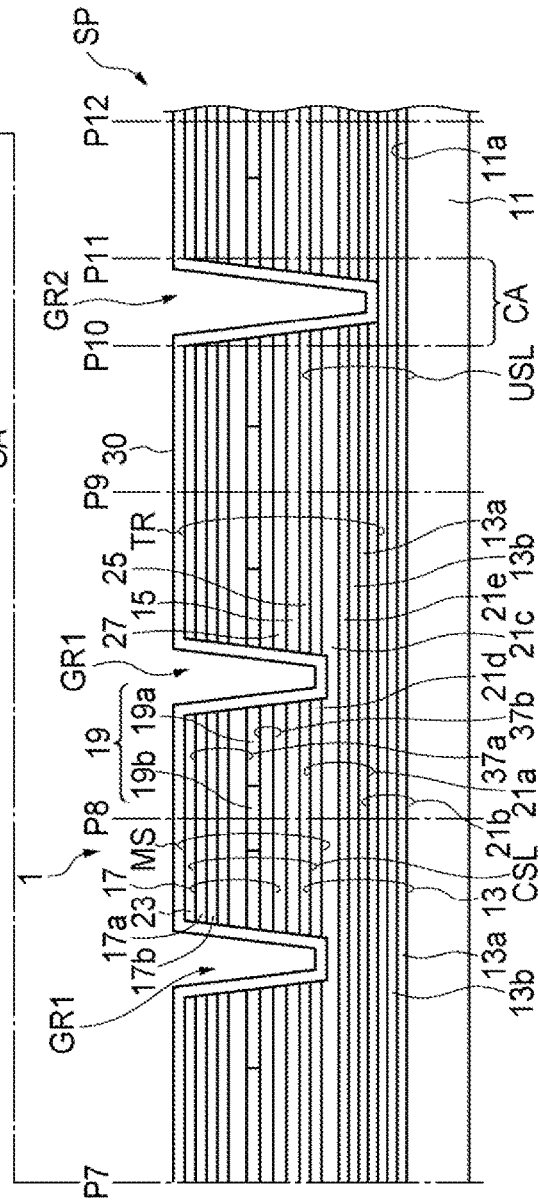

In step S1a, the intermediate product SP is fabricated. As it is understood from the following description, the intermediate product SP is fabricated by using a semiconductor process including crystal growth, insulating layer deposition, photolithography, and etching. A structure of the intermediate product SP is described. As illustrated in FIGS. 2, 3A, and 3B, the intermediate product SP has a first area A1 and one or a plurality of second areas A2. In the first area A1, an array (one-dimensional or two-dimensional array) of device sections of the substrate product BP is formed. In the second area A2, a pad electrode for supplying electric power to the array of the device sections during a burn-in test is formed. The first area A1 includes a separation area CA at which device sections DS on a wafer product formed in a subsequent step is separated into semiconductor chips by cutting the wafer product. The separation area CA extends in vertical and horizontal directions so as to divide the first area A1 and define the device sections DS. The second area A2 is positioned in the intermediate product SP to allow electric power supply and optical measurement to be executed on the array of the device sections in the first area A1 during a burn-in test. In this embodiment, one and the other second areas A2 are, for example, adjacent to the first area A1. The second areas A2 are positioned at both sides of the first area A1. One second area A2, the first area A1, and the other second area A2 are arranged in this order in a direction of a first axis Ax1. A first device section DS1 is adjacent to the one second area A2. A second device section DS2 is adjacent to the other second area A2. The first area A1 has two-dimensionally arrayed device sections DS. Each device section DS includes a semiconductor mesa MS, a first groove GR1, and a terrace TR. The semiconductor mesa MS is separated from the terrace TR by the first groove GR1. The separation area CA includes a second groove GR2. The second groove GR2 extends in the array directions of the device sections DS, and more specifically in the vertical and horizontal directions to surround each of the device sections DS. The first groove GR1 and the second groove GR2 are formed by using a photolithography method and an etching method.

Regarding the array of the device sections DS, for example, a first device section DS1, a second device section DS2, a third device section DS3, a fourth device section DS4, a fifth device section DS5, and a sixth device section DS6 are illustrated for easier reference in the following description. The fourth device section DS4 is adjacent to, for example, the third device section DS3, the fifth device section DS5, and the sixth device section DS6.

The semiconductor mesa MS of the intermediate product SP includes a stacked semiconductor layer for forming a vertical cavity. Specifically, the semiconductor mesa MS includes a lower stacked semiconductor layer 13 for forming a lower distributed Bragg reflector, an active layer 15, an upper stacked semiconductor layer 17 for forming an upper distributed Bragg reflector, and an upper contact layer 23. The lower stacked semiconductor layer 13, the active layer 15, the upper stacked semiconductor layer 17, and the upper contact layer 23 are arranged in that order in a direction of normal to a principal surface 11a of a substrate 11. The active layer 15 is provided between the upper stacked semiconductor layer 17 and the lower stacked semiconductor layer 13. Also, the terrace TR of the intermediate product SP includes the same stacked semiconductor layer as that of the semiconductor mesa MS.

The lower stacked semiconductor layer 13 includes semiconductor layers (13a, 13b) for forming a distributed Bragg reflector. The semiconductor layers (13a, 13b) are alternately arranged in the direction of normal to the principal surface 11a of the substrate 11. Specifically, the lower stacked semiconductor layer 13 includes a first lower stacked semiconductor layer 21a composed of a conductive semiconductor, and a second stacked semiconductor layer 21b composed of an undoped semiconductor. The first lower stacked semiconductor layer 21a includes a lower contact layer 21c, a first stacked semiconductor layer 21d, and a second stacked semiconductor layer 21e. The lower contact layer 21c is provided between the first stacked semiconductor layer 21d and the second stacked semiconductor layer 21e. The upper stacked semiconductor layer 17 includes semiconductor layers (17a, 17b) for forming a distributed Bragg reflector. The semiconductor layers (17a, 17b) are alternately arranged in the direction of normal to the principal surface 11a of the substrate 11. In this embodiment, the upper stacked semiconductor layer 17 includes a first semiconductor layer 19 for forming a current confinement structure.

The active layer 15 has a quantum well structure (for example, aluminum gallium arsenide (AlGaAs)/gallium arsenide (GaAs) multi quantum well (MQW) structure). The semiconductor mesa MS includes a first confinement layer 25 and a second confinement layer 27 if required. The active layer 15 is provided between the first confinement layer 25 and the second confinement layer 27.

An example of the intermediate product SP
Substrate 11: 4-inch size GaAs semiconductor wafer
Lower stacked semiconductor layer 13
First lower stacked semiconductor layer 21a: n-type GaAs/i-type AlGaAs superlattice, or n-type GaAs/n-type AlGaAs superlattice
Second lower stacked semiconductor layer 21b: i-type GaAs/i-type AlGaAs superlattice
Lower contact layer 21c: n-type GaAs
Active layer 15: GaAs/AlGaAs quantum well structure
First confinement layer 25: AlGaAs
Second confinement layer 27: AlGaAs
Upper stacked semiconductor layer 17: p-type GaAs/p-type AlGaAs superlattice
First semiconductor layer 19 for forming current confinement structure: AlGaAs, Al composition 0.9 to 0.99
Upper contact layer 23: p-type GaAs or p-type AlGaAs
The stacked semiconductor layers are grown by, for example, a metal-organic vapor phase epitaxy method, or a molecular beam epitaxial growth method.

The intermediate product SP includes an insulating layer 30 provided on the first area A1 and the second area A2. Specifically, the insulating layer 30 is provided to cover the semiconductor mesa MS, the terrace TR, the first groove GR1, and the second groove GR2. The insulating layer 30 includes a silicon-based inorganic insulator film such as silicon nitride (SiN) film or silicon dioxide ($SiO_2$) film. The insulating layer 30 is formed by using, for example, a chemical vapor deposition (CVD) method. The first groove GR1 reaches the lower contact layer 21c in the lower stacked semiconductor layer 13. The second groove GR2 penetrates through a conductive stacked semiconductor layer CSL, and reaches the second lower stacked semiconductor layer 21b in an undoped stacked semiconductor layer USL.

Figure 4:
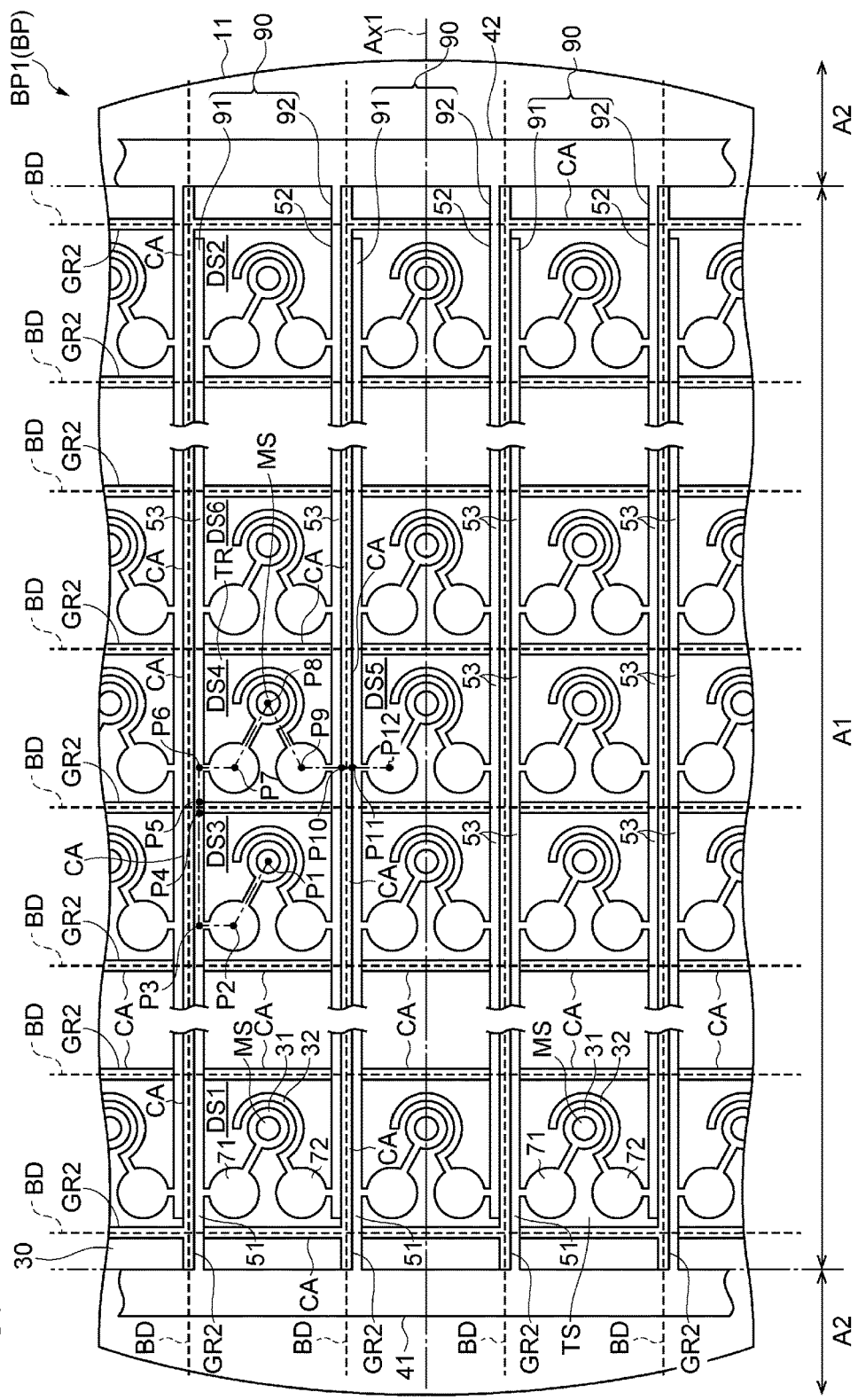
FIG. 4 is a plan view schematically illustrating a parallel-connection substrate product in a step illustrated in FIG. 1 (step of forming conductor and pad electrode).
Figures 5A, 5B:
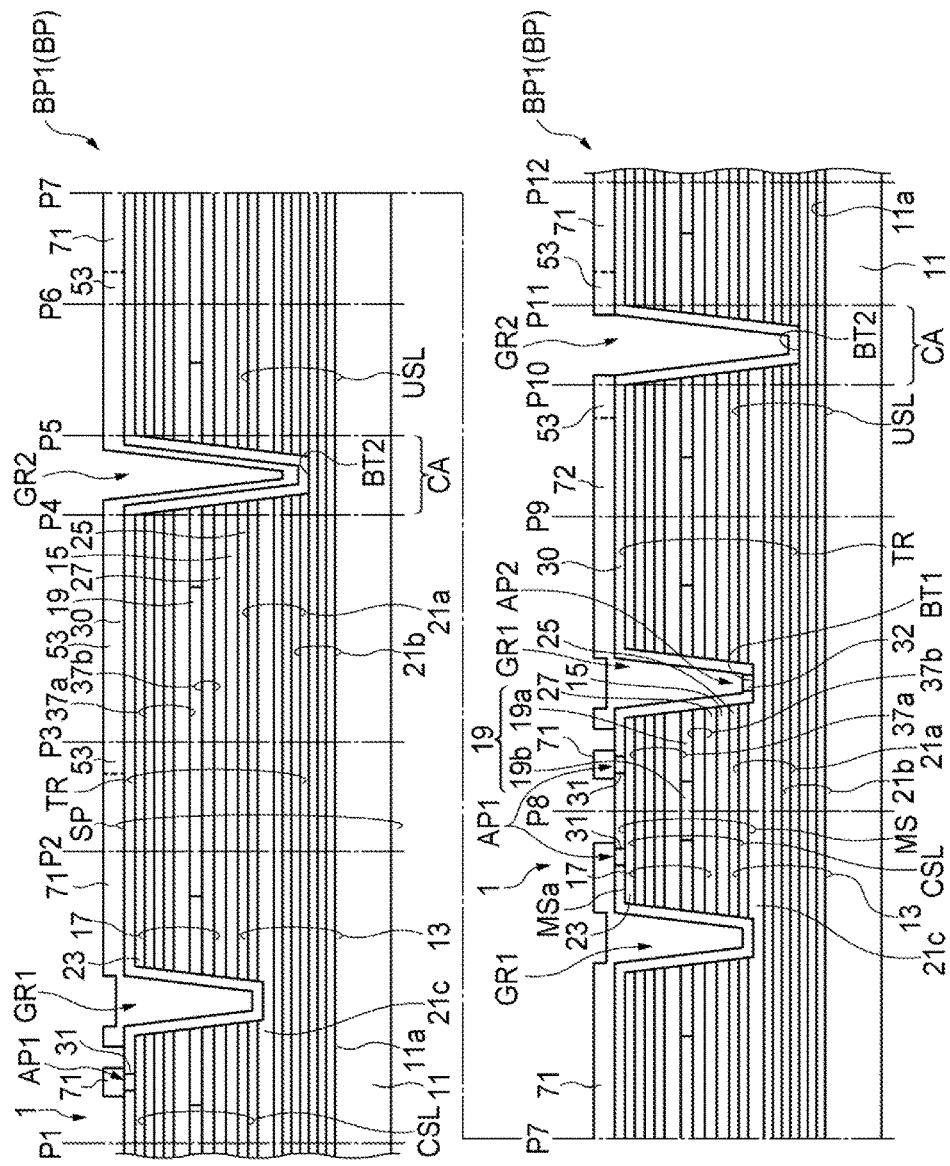
FIGS. 5A and 5B are cross-sectional views taken along line P1-P7 and line P7-P12 illustrated in FIG. 2.
Figure 6:
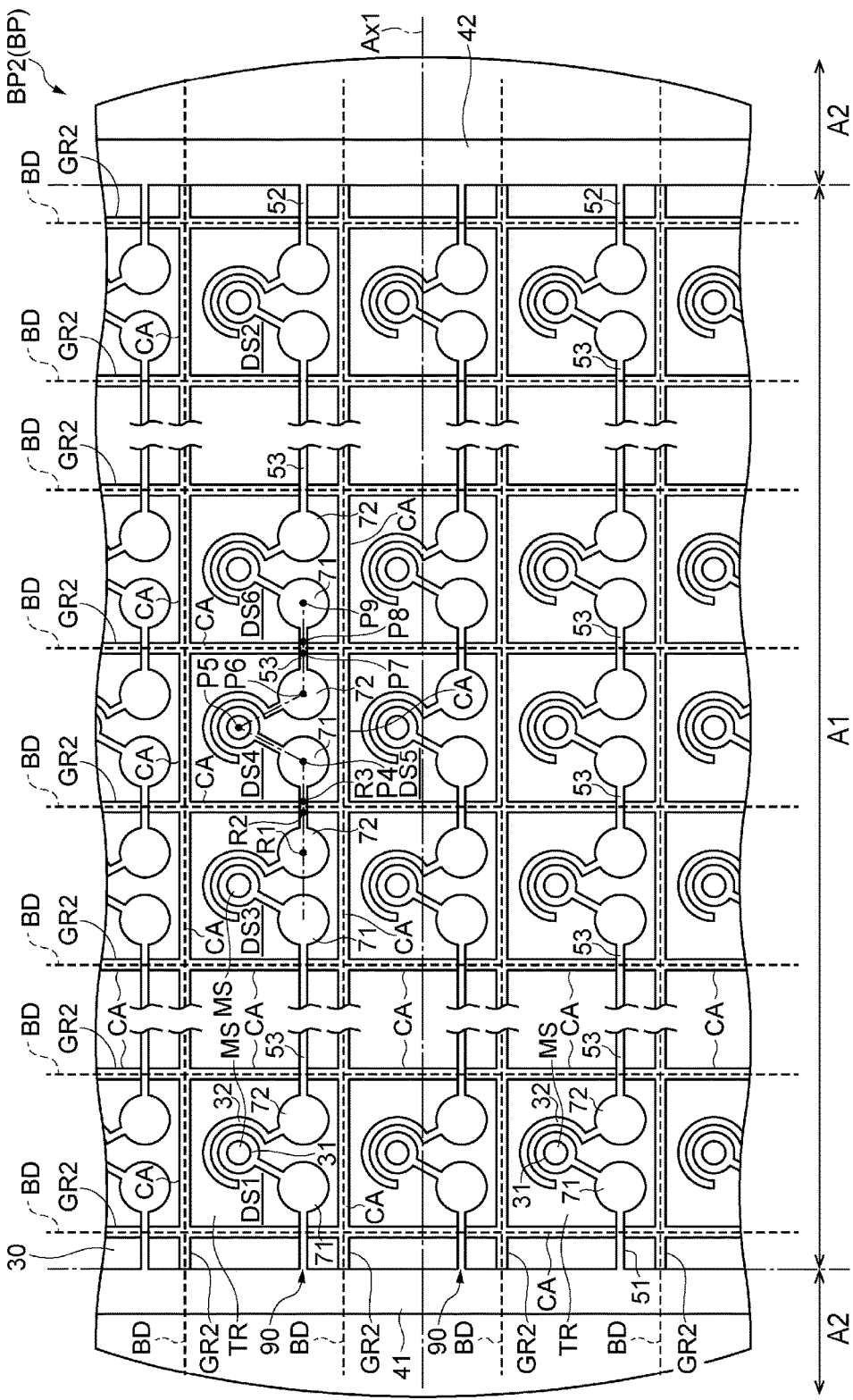
FIG. 6 is a plan view schematically illustrating a series-connection substrate product in the step illustrated in FIG. 1 (step of forming conductor and pad electrode).

An electrode of a surface-emitting laser, and a pad electrode and a conductor used for supplying electric power to the array of the device sections during a burn-in test are formed on the intermediate product SP. FIGS. 4, 5A, and 5B illustrate a metal body that supplies electric power in parallel to a surface-emitting laser of a device section during a burn-in test, and a substrate product BP1 including an electrode of the surface-emitting laser. Specifically, FIGS. 5A and 5B are cross-sectional views taken along line P1-P7 and line P7-P12 illustrated in FIG. 4. FIGS. 6 and 7 illustrate a metal body that supplies electric power in series to a surface-emitting laser of a device section during a burn-in test, and a substrate product BP2 having an electrode of the surface-emitting laser. Specifically, FIG. 7 is a cross-sectional view taken along line R1-R9 illustrated in FIG. 6.

In step S1b, a first electrode 31 and a second electrode 32 illustrated in FIGS. 5A, 5B, and 7 are formed on each device section DS. Specifically, before a metal film for electrodes is formed, a first opening AP1 and a second opening AP2 are formed in the insulating layer 30 by using a photolithography method and an etching method. The first opening AP1 is located above the semiconductor mesa MS. The second opening AP2 is located at a bottom BT1 of the first groove GR1. The first electrode 31 and the second electrode 32 are fabricated by using, for example, a lift-off method. The first electrode 31 and the second electrode 32 each contain, for example, titanium platinum gold (TiPtAu) or gold germanium nickel (AuGeNi). The first electrode 31 is one of an anode electrode and a cathode electrode (in this embodiment, anode electrode). The second electrode 32 is the other of the anode electrode and the cathode electrode (in this embodiment, cathode electrode). The first electrode 31 is located above the semiconductor mesa MS. The second electrode 32 is located at the bottom BT1 of the first groove GR1. The first electrode 31 and the second electrode 32 respectively contact an upper surface MSa of the semiconductor mesa MS and the lower contact layer 21c.

In step S1c, after the first electrode 31 and the second electrode 32 are formed, a pad electrode and a conductor are formed on the intermediate product SP and hence the substrate product BP is obtained. In this embodiment, a first pad electrode 41, a second pad electrode 42, and a plurality of conductors 90 illustrated in FIGS. 4 and 6 are formed. The conductors 90 are provided in the first area A1. The first pad electrode 41 and the second pad electrode 42 are provided in the second areas A2. The first pad electrode 41 serves as one of an external anode electrode and an external cathode electrode to be used during the burn-in test. The second pad electrode 42 serves as the other of the external anode electrode and the external cathode electrode to be used during the burn-in test. The conductors 90 are used for connection between the device sections DS each including the anode electrode and the cathode electrode of the surface-emitting laser, between the device sections DS and a first conductor 51, and between the device sections DS and the second pad electrode 42. The conductors 90, the first pad electrode 41, and the second pad electrode 42 contain, for example, gold (Au).

The substrate product BP1 and the substrate product BP2 each include the intermediate product SP, and the first pad electrode 41, the second pad electrode 42, the first conductor 51, a second conductor 52, a third conductor 53, a first laser pad electrode 71, and a second laser pad electrode 72. The first pad electrode 41, the second pad electrode 42, the first conductor 51, the second conductor 52, the third conductor 53, the first laser pad electrode 71, and the second laser pad electrode 72 are provided on the intermediate product SP. Regarding the substrate product BP, each device section DS includes the first laser pad electrode 71 and the second laser pad electrode 72.

As illustrated in FIGS. 5A, 5B, and 7, the first laser pad electrode 71 is one of an anode electrode and a cathode electrode (in this embodiment, anode electrode) of the surface-emitting laser. The first laser pad electrode 71 is connected to the upper surface MSa of the semiconductor mesa MS through, for example, the first electrode 31. The second laser pad electrode 72 is the other of the anode electrode and the cathode electrode (in this embodiment, cathode electrode) of the surface-emitting laser. The second laser pad electrode 72 is connected to the lower contact layer 21c through, for example, the second electrode 32. The first pad electrode 41, the second pad electrode 42, the conductors 90 (the first conductor 51, the second conductor 52, the third conductor 53), the first laser pad electrode 71, and the second laser pad electrode 72 include, for example, a gold electrode. Also, the gold electrode is formed by, for example, plating or a lift-off method. A mask pattern that is used for forming the first pad electrode 41, the second pad electrode 42, the first conductor 51, the second conductor 52, the third conductor 53, the first laser pad electrode 71, and the second laser pad electrode 72 is to be understood on the basis of the following description.

As illustrated in FIGS. 4 to 7, in the substrate product BP, the first conductor 51 and the second conductor 52 extend across boundaries between the first area A1 and the second areas A2. The third conductor 53 extends across boundaries BD of the device sections DS.

The first conductor 51 connects the first pad electrode 41 to the first electrode 31 in the surface-emitting laser 1 of the first device section DS1. Specifically, the first conductor 51 connects the first pad electrode 41 to the first laser pad electrode 71 in the first device section DS1. The second conductor 52 connects the second pad electrode 42 to the second electrode 32 in the surface-emitting laser 1 of the second device section DS2. Specifically, the second conductor 52 connects the second pad electrode 42 to the second laser pad electrode 72 in the second device section DS2.

Structure of Parallel Connection

As illustrated in FIGS. 4, 5A, and 5B, the device sections DS of the substrate product BP1 are connected in parallel between the first pad electrode 41 and the second pad electrode 42. The third conductor 53 extends across the boundary BD between certain adjacent device sections in the two-dimensional array of the device sections. For example, the third conductor 53 extends from the third device section DS3 to the fourth device section DS4 across the boundary BD between the third device section DS3 and the fourth device section DS4. Further, the third conductor 53 connects one of the first laser pad electrode 71 and the second laser pad electrode 72 (in this embodiment, first laser pad electrode 71) of the third device section DS3 to one of the first laser pad electrode 71 and the second laser pad electrode 72 (in this embodiment, first laser pad electrode 71) of the fourth device section DS4. Another third conductor 53 extends from the third device section DS3 to the fourth device section DS4 across the boundary BD between the third device section DS3 and the fourth device section DS4. Also, the other third conductor 53 connects the other of the first laser pad electrode 71 and the second laser pad electrode 72 (in this embodiment, second laser pad electrode 72) of the third device section DS3 to the other of the first laser pad electrode 71 and the second laser pad electrode 72 (in this embodiment, second laser pad electrode 72) of the fourth device section DS4.

The substrate product BP1 includes a first metal body 91 and a second metal body 92 extending in one direction of the two-dimensional array of the device sections. The first metal body 91 includes the first conductor 51 and the third conductor 53, and extends along the array of the device sections DS arranged in the direction of the first axis Ax1. The second metal body 92 includes the second conductor 52 and the third conductor 53, and extends along the array of the device sections DS arranged in the direction of the first axis Ax1. The third conductor 53 extending in the direction of the first axis Ax1 connects the first laser pad electrodes 71 of certain adjacent device sections DS of the device sections DS arrayed in this direction to one another. Specifically, the line of the third conductor 53 is connected to the first conductor 51. The first conductor 51 and the third conductor 53 form the first metal body 91 that penetrates through the array of the device sections. Also, another third conductor 53 extending in the above-described direction connects the second laser pad electrodes 72 of certain adjacent device sections DS of the device sections DS arrayed in this direction to one another. The line of the other third conductor 53 is connected to the second conductor 52. The second conductor 52 and the third conductor 53 form the second metal body 92 that penetrates through the array of the device sections. In the substrate product BP1, certain adjacent device sections are connected to one another by a pair of third conductors 53. The device sections DS arrayed in the above-described direction are connected in parallel between the first metal body 91 and the second metal body 92.

In each device section DS of the substrate product BP1, the first laser pad electrode 71 and the second laser pad electrode 72 are arrayed in a direction that intersects with the first axis Ax1. This array is preferable for parallel connection.

Structure of Series Connection

As illustrated in FIGS. 6 and 7, the device sections DS of the substrate product BP2 are connected in series between the first pad electrode 41 and the second pad electrode 42. The third conductor 53 extends across the boundary BD between certain adjacent device sections in the two-dimensional array of the device sections. For example, the third conductor 53 extends from the third device section DS3 to the fourth device section DS4 across the boundary BD between the third device section DS3 and the fourth device section DS4. Also, the third conductor 53 connects one of the first laser pad electrode 71 and the second laser pad electrode 72 (in this embodiment, second laser pad electrode 72) in the surface-emitting laser 1 of the third device section DS3 to the other of the first laser pad electrode 71 and the second laser pad electrode 72 (in this embodiment, first laser pad electrode 71) in the surface-emitting laser 1 of the fourth device section DS4. Another third conductor 53 extends across the boundary BD between other certain adjacent device sections. For example, the other third conductor 53 extends from the fourth device section DS4 to the sixth device section DS6 across the boundary between the fourth device section DS4 and the sixth device section DS6. Also, the other third conductor 53 connects one of the first laser pad electrode 71 and the second laser pad electrode 72 (in this embodiment, second laser pad electrode 72) in the surface-emitting laser of the fourth device section DS4 to the other of the first laser pad electrode 71 and the second laser pad electrode 72 (in this embodiment, first laser pad electrode 71) in the surface-emitting laser 1 of the sixth device section DS6.

In the substrate product BP2, certain adjacent device sections are connected to one another by a single third conductor 53. The device sections DS arrayed in the above-described direction and the third conductor 53 are alternately arrayed in a connection line between the first pad electrode 41 and the second pad electrode 42. Also, the device sections DS are connected in series between the first pad electrode 41 and the second pad electrode 42.

In each device section DS of the substrate product BP2, the first laser pad electrode 71 and the second laser pad electrode 72 are arrayed in the direction of the first axis Ax1. This array is preferable for series connection.

Step S2 illustrated in FIG. 1 is described. FIGS. 8A, 8B, 9A, 9B, 10A, and 10B each illustrate an exemplary burn-in apparatus that is used for the dynamic burn-in test on the substrate product BP for forming the surface-emitting laser. A burn-in apparatus BN includes a connection device 2 that allows electric power to be supplied in a burn-in test. In step S2, the connection device 2 is attached to the substrate product BP. The connection device 2 is connected to the first pad electrode 41 and the second pad electrode 42 of the substrate product BP.

The burn-in apparatus BN is described with reference to FIGS. 8A to 10B. The connection device 2 of the burn-in apparatus BN includes a probe device 7 and an optical window 8a. The probe device 7 supplies electric power for a burn-in test to the first pad electrode 41 and the second pad electrode 42 of the substrate product BP. The optical window 8a is used for optical measurement that is executed during the burn-in test. The connection device 2 is positioned in the burn-in apparatus BN so that the optical window 8a is located above the first area A1 of the substrate product BP. By the positioning, optical measurement on the substrate product BP may be executed during the burn-in test by using the connection device 2 attached to the substrate product BP.

The connection device 2 includes a wafer support base 3, a temperature control device 4, a power supply 5, and a light receiving apparatus 6. The substrate product BP is held by the wafer support base 3. The substrate product BP is held by using a vacuum chuck, an electrostatic chuck, or a mechanical chuck, for example. The wafer support base 3 is connected to the temperature control device 4. The temperature control device 4 may change the temperature of a support surface 3a of the wafer support base 3. Specifically, the temperature control device 4 may change the temperature of the substrate product BP, for example, from a room temperature (for example, 27 degrees centigrade) to a high temperature. The high temperature used in the burn-in test is in a range from 70 to 200 degrees centigrade. The temperature of the support surface 3a of the wafer support base 3 is measured, for example, by a temperature measurement device, such as a thermocouple, a thermistor, or a radiation thermometer. The measurement results of laser characteristics at high temperatures are used for judging whether the laser characteristics of the surface-emitting laser 1 satisfy a predetermined standard or not.

The probe device 7 of the connection device 2 includes a probe support base 7a, a first probe 7p, and a second probe 7q. The probe support base 7a has an opening 7b and a support member 7c. The opening 7b is used for optical measurement to be executed during the burn-in test, and the support member 7c supports the first probe 7p and the second probe 7q. The support member 7c defines, for example, the opening 7b. The light receiving apparatus 6 receives light emitted by the substrate product BP through the opening 7b of the probe support base 7a during the burn-in test. The first probe 7p and the second probe 7q are connected to the first pad electrode 41 and the second pad electrode 42 of the substrate product BP.

As illustrated in FIGS. 8A to 10B, the first probe 7p and the second probe 7q are respectively connected to the first pad electrode 41 and the second pad electrode 42 in the second areas A2 located outside the first area A1. The probe device 7 may apply voltage or current to the substrate product BP through the first probe 7p and the second probe 7q. In this embodiment, the second areas A2 in which the first pad electrode 41 and the second pad electrode 42 are provided are located in an outer peripheral area of the substrate product BP. The first area A1 including the array of the device sections DS is located in an inner area of the substrate product BP. Such arrangement of the first area A1 and the second areas A2 allows the first probe 7p and the second probe 7q to respectively contact the first pad electrode 41 and the second pad electrode 42.

The power supply 5 may supply voltage or current to the substrate product BP. The power supply 5 is, for example, a device, such as a source meter and a semiconductor parameter analyzer. The power supply 5 is a single device that executes both application of electric power to the substrate product BP and characteristics measurement on the surface-emitting laser 1. The power supply 5 may include a device for electric power supply and a device using for the measurement of device characteristics. The probe device 7 includes the first probe 7p and the second probe 7q for electric power supply, and an additional probe for the measurement of the electrical characteristics. The additional probe is provided so as to be also connected to the first pad electrode 41 and the second pad electrode 42.

The light receiving apparatus 6 includes a light receiving device 6d such as a photodiode. The light receiving device 6d receives a laser beam from the surface-emitting laser. The light receiving device 6d is held by a stage 6s. The position and angle of the stage 6s are adjusted in a plurality of directions or orientations. This adjustment is executed by a stage controller 6t, and is set at a position and an angle in, for example, three-axis directions or five-axis directions. The position of the light receiving device 6d is aligned with a desirable area on the substrate product BP by the stage 6s and the stage controller 6t, and is used for optical measurement in one or a plurality of device sections at the position. After the optical measurement at the measurement position is completed, the measurement position is moved to the next area in the substrate product BP, and the optical measurement is executed on the surface-emitting laser in this area.

The burn-in apparatus BN further includes a constant temperature bath 8 that stably maintains the burn-in temperature and atmosphere. The constant temperature bath 8 includes the wafer support base 3, the substrate product BP on the wafer support base 3, the light receiving device 6d, and the stage 6s therein. In the burn-in test, the constant temperature bath 8 also includes the substrate product BP therein. The constant temperature bath 8 has the atmosphere of nitrogen or air at 90 degrees centigrade, for example. The temperature of the constant temperature bath 8 is changed in a range of burn-in temperatures higher than the room temperature. The burn-in temperature is set, for example, in a range from 70 to 200 degrees centigrade. The burn-in temperature is measured by a thermometer provided in the constant temperature bath 8. The constant temperature bath 8 has a housing that includes the optical window 8a located above the substrate product BP. The optical window 8a allows the substrate product BP in the constant temperature bath 8 to be observed through the opening 7b of the probe support base 7a in the constant temperature bath 8. The optical window 8a is made of a window material, such as silica glass, zinc selenide (ZnSe), or sapphire, capable of transmitting light from the surface-emitting laser. The stage controller 6t may be included in the constant temperature bath 8 if required in addition to the wafer support base 3, the light receiving device 6d, and the stage 6s.

First Burn-In Apparatus

FIGS. 8A and 8B schematically illustrate a first burn-in apparatus. To show the substrate product BP, FIG. 8B does not illustrate the temperature control device 4, the power supply 5, and an optical lens 6a illustrated in FIG. 8A. A first burn-in apparatus BN1 executes optical measurement on the surface-emitting laser 1. For example, the first burn-in apparatus BN1 receives a laser beam during a burn-in test for the optical measurement. As illustrated in FIGS. 8A and 8B, the substrate product BP is provided on the wafer support base 3 in the constant temperature bath 8. In this embodiment, the light receiving apparatus 6 simultaneously receives laser beams from surface-emitting lasers 1 in a plurality of device sections DS (for example, four device sections DS) included in a measurement area MP through the optical lens 6a. The laser beams are converted into electric signals by a photoelectric conversion device such as a charge-coupled device (CCD) camera, a complementary metal-oxide semiconductor (CMOS) camera, or a photodiode array device. Hence optical characteristics of the surface-emitting lasers 1 in the device sections DS is obtained. The substrate product BP and the measurement system are moved relative to one another, and the position of the optical lens 6a is aligned with the measurement area MP by using the stage 6s and the stage controller 6t. Then, optical measurement in a certain measurement area MP is executed by using the light receiving apparatus 6. Likewise, the position of the optical lens 6a is aligned with the next measurement area MP. After this position alignment, optical measurement in the next measurement area MP is executed.

Second Burn-In Apparatus

FIGS. 9A and 9B schematically illustrate a second burn-in apparatus. To show the substrate product BP, FIG. 9B does not illustrate the temperature control device 4, the power supply 5, and an optical fiber array 6b illustrated in FIG. 9A. A second burn-in apparatus BN2 executes optical measurement on the surface-emitting laser 1. For example, the second burn-in apparatus BN2 receives a laser beam during a burn-in test for the optical measurement. As illustrated in FIGS. 9A and 9B, the light receiving apparatus 6 includes the optical fiber array 6b. In this embodiment, the optical fiber array 6b includes a plurality of optical fibers (for example, optical fibers of three rows by three lines). The stage 6s supports the optical fiber array 6b. Tip ends of optical fibers of the optical fiber array 6b are arrayed with the almost same pitch as the pitch of device sections DS. By using the light receiving apparatus 6, the tip ends of the optical fibers may be brought close to the substrate product BP so as to be at a distance of about 50 μm. The light receiving apparatus 6 receives laser beams from a measurement area MP including nine device sections DS simultaneously. The laser beams are detected by using, for example, a power meter or a spectrum analyzer. The second burn-in apparatus BN2 allows measurement on the oscillation wavelength of laser beams from the surface-emitting lasers 1 during a burn-in test. When a plurality of device sections DS are measured, the channel of a spectrum analyzer may be changed, or a plurality of spectrum analyzers may be used. The substrate product BP and the measurement system are moved relative to one another, and the position of the optical fiber array 6b is aligned with a measurement area MP by using the stage 6s and the stage controller 6t. Then, optical measurement in a certain measurement area MP is executed by using the light receiving apparatus 6. Likewise, the position of the optical fiber array 6b is aligned with the next measurement area MP. After this position alignment, optical measurement in the next measurement area MP is executed.

Third Burn-In Apparatus

FIGS. 10A and 10B schematically illustrate a third burn-in apparatus. To show the substrate product BP, FIG. 10B does not illustrate the temperature control device 4, the power supply 5, and an objective lens 6c illustrated in FIG. 10A. As illustrated in FIGS. 10A and 10B, the light receiving apparatus 6 includes one or a plurality of objective lenses 6c. The objective lenses 6c are supported by the stage 6s. The objective lenses 6c are arrayed with the almost same pitch as the pitch of device sections DS. By using the objective lenses 6c, laser beams from surface-emitting lasers 1 of a plurality of device sections DS may be measured. The third burn-in apparatus BN3 allows measurement on laser beams from the surface-emitting lasers 1 during a burn-in test. The laser beams are detected by using, for example, a power meter or a spectrum analyzer through the objective lenses 6c. In this embodiment, a single objective lens 6c is aligned with a single device section DS included in the measurement area MP. The light receiving apparatus 6 may measure laser beams from surface-emitting lasers 1 in the measurement area MP. The substrate product BP and the measurement system are moved relative to one another, and the objective lenses 6c are aligned with the measurement area MP by using the stage 6s and the stage controller 6t. Then, optical measurement in a certain measurement area MP is executed by using the light receiving apparatus 6. Likewise, the objective lenses 6c are aligned with the next measurement area MP. After this position alignment, optical measurement in the next measurement area MP is executed.

The description returns to the description of the fabrication process illustrated in FIG. 1.

In step S3, a burn-in test is executed on the substrate product BP before the substrate product BP is separated into semiconductor chips. A burn-in test is one of the screening tests. The burn-in test is performed to a surface-emitting laser 1 of the substrate product BP by applying a constant voltage or current in a high-temperature environment. With the burn-in test, initial failure of the surface-emitting laser 1 can be eliminated. The temperature of the substrate product BP is maintained at a temperature higher than the room temperature, for example, in a range from 70 to 200 degrees centigrade. Electric power is applied to the substrate product BP by using the connection device 2, and the optical characteristics of a surface-emitting laser 1 in a device section DS of the substrate product BP is measured by using the light receiving apparatus 6. The result of the optical measurement thus obtained is stored in the light receiving apparatus 6.

A burn-in test on the substrate product BP1 and the substrate product BP2 is specifically described. In the burn-in test, the temperature of the support surface 3a of the wafer support base 3 is, for example, 90 degrees centigrade or higher, and the burn-in period is, for example, 50 hours or more.

In the burn-in test on the substrate product BP1, a constant voltage is applied to the substrate product BP1 by using a power supply at a high temperature. This burn-in test is referred to as "constant-voltage burn-in." In the constant-voltage burn-in, a constant voltage is applied to surface-emitting lasers 1 of a plurality of device sections DS. The voltage to be applied to the substrate product BP1 in the constant-voltage burn-in (the potential difference between the first pad electrode and the second pad electrode) may be, for example, 2.0 volts. The voltage between the first pad electrode and the second pad electrode is applied to the plurality of device sections DS connected in parallel between the first pad electrode and the second pad electrode.

Alternatively, in the burn-in test on the substrate product BP2, a constant current is applied to the substrate product BP2 by using a power supply at a high temperature. This burn-in test is referred to as "constant-current burn-in." In the constant-current burn-in, a constant current is applied to surface-emitting lasers 1 of a plurality of device sections DS. In the constant-current burn-in, the current to be applied to the substrate product BP2 from the power supply 5 (current flowing through the first pad electrode and the second pad electrode) is, for example, 10 milliamperes. The current flowing through the first pad electrode and the second pad electrode flows through the plurality of device sections DS connected in series between the first pad electrode and the second pad electrode.

For the constant-voltage burn-in and the constant-current burn-in, three methods may be executed as follows. The following description about the methods is given for the constant-voltage burn-in using the substrate product BP1; however, the constant-current burn-in using the substrate product BP2 is also executed likewise.

First Burn-In Test

The method of a first burn-in test follows the processes below.

Process (1): the temperature of the substrate product BP1 (substrate product BP2) is maintained at a high temperature (for example, 90 degrees centigrade).

Process (2): at the start of the burn-in test, the threshold current of a surface-emitting laser 1 is measured.

Process (3): by applying a constant voltage (constant current) to the substrate product BP1 (substrate product BP2), the output intensity of light emitted from the surface-emitting laser 1 is measured, and the measurement value is stored in the light receiving apparatus 6.

Process (4): while the temperature of the substrate product BP1 (substrate product BP2) is maintained at the high temperature, application of voltage (current) to the substrate product BP1 (substrate product BP2) is temporarily stopped.

Process (5): the voltage (current) to be applied to the substrate product BP1 (substrate product BP2) is changed, for example, in a range from 0 to 1.5 times the voltage (current) at the start of the burn-in test, and the output intensity of light emitted from the surface-emitting laser 1 is measured. The measurement value is stored in the light receiving apparatus 6 if required. Specifically, the relationship between the output intensity and current (L-I characteristics) for a surface-emitting laser 1 in a device section DS is measured by using a power meter. Using the measurement result, the value of threshold current ($I_{th}$) is obtained.

Process (6): the measured device section DS in the substrate product BP1 (substrate product BP2) is judged whether "good" or "failed." It is judged whether or not the measured threshold current exceeds a predetermined variation range, for example, whether or not the measured threshold current varies by plus or minus 20% or more with reference to the threshold current at the start of the burn-in test.

Process (7): if the judgment represents occurrence of a variation exceeding the predetermined value by, for example, a variation of 20% or more, the surface-emitting laser 1 of this device section DS is recorded as "failed."

Second Burn-In Test

The method of a second burn-in test follows the processes below.

Process (1): the temperature of the substrate product BP1 (substrate product BP2) is maintained at a high temperature (for example, 90 degrees centigrade).

Process (2): at the start of the burn-in test, the output intensity of light emitted from a surface-emitting laser 1 is measured.

Process (3): while the temperature of the substrate product BP1 (substrate product BP2) is maintained at the high temperature, by applying a constant voltage (constant current) to the substrate product BP1 (substrate product BP2), the output intensity of light emitted from the surface-emitting laser 1 is measured, and the measurement value is stored in the light receiving apparatus 6.

Process (4): the measured device section DS in the substrate product BP1 (substrate product BP2) is judged whether "good" or "failed." Specifically, the output intensity of light emitted from the surface-emitting laser 1 in the device section DS is measured by using a power meter while the temperature of the substrate product BP1 (substrate product BP2) is maintained at the high temperature.

Process (5): using the measurement result, it is judged whether or not the output intensity exceeds a predetermined variation range, for example, whether or not the output intensity varies by plus or minus 20% or more with reference to the output intensity at the start of the burn-in test.

Process (6): if the judgment represents occurrence of a variation exceeding the predetermined value by, for example, a variation of 20% or more, the surface-emitting laser 1 of this device section DS is recorded as "failed."

Third Burn-In Test

The method of a third burn-in test follows the processes below.

Process (1): the temperature of the substrate product BP1 (substrate product BP2) is maintained at a high temperature (for example, 90 degrees centigrade).

Process (2): at the start of the burn-in test, the spectrum of light emitted from a surface-emitting laser 1 is measured.

Process (3): by applying a constant voltage (constant current) to the substrate product BP1 (substrate product BP2), the spectrum of light emitted from the surface-emitting laser 1 is measured, and the measurement value is stored in the light receiving apparatus 6.

Process (4): the measured device section DS in the substrate product BP1 (substrate product BP2) is judged whether "good" or "failed." Specifically, the spectrum of light emitted from the surface-emitting laser 1 in the device section DS is measured by using a spectrum analyzer while the temperature of the substrate product BP1 (substrate product BP2) is maintained at the high temperature. Using the measurement result, the center wavelength of the spectrum is determined.

Process (5): the measured device section DS in the substrate product BP1 (substrate product BP2) is judged whether "good" or "failed." It is judged whether or not the determined center wavelength exceeds a predetermined variation range, for example, whether or not the determined center wavelength varies by plus or minus 0.1 nm or more with reference to the center wavelength of the spectrum at the start of the burn-in test.

Process (6): if the judgment represents occurrence of a variation exceeding the predetermined value by, for example, a variation of 0.1 nm or more, the surface-emitting laser 1 of this device section DS is recorded as "failed."

In the first burn-in test to the third burn-in test, the device section DS judged as "failed" may be marked with ink, for example. The marked semiconductor chip is discarded. Also, if the number of device sections DS judged as "failed" exceeds 90% of the total number of device sections DS in the substrate product BP1 (substrate product BP2), the burn-in test may be ended. The measurement result of the burn-in test may be recorded in the light receiving apparatus 6, and the substrate product BP1 (substrate product BP2) may be discarded.

Before the burn-in test, preparatory measurement may be executed. For example, laser characteristics of surface-emitting lasers in a plurality of device sections DS (for example, five points in plane) located at the inner side by 5 mm or more from the outer edge of the wafer of the substrate product BP1 (substrate product BP2) may be measured. If the laser characteristics satisfy a predetermined value, the burn-in test on the device sections DS may be started.

Fourth Burn-In Test

The method of a fourth burn-in test follows the processes below.

Process (1): the temperature of the substrate product BP1 (substrate product BP2) is maintained at a high temperature (for example, 90 degrees centigrade).

Process (2): at the start of the burn-in test, the electric resistance value of a device section DS of the substrate product BP1 (substrate product BP2) is measured.

Process (3): by applying a constant voltage (constant current) to the substrate product BP1 (substrate product BP2), the electric resistance value of the device section DS is measured, and the measurement value is stored in the light receiving apparatus 6.

Process (4): while the temperature of the substrate product BP1 (substrate product BP2) is maintained at the high temperature, the current value (voltage value) of the device section DS is measured by using an ammeter (a voltmeter). Using the measurement result, the electric resistance value of the device section DS is determined.

Process (5): it is judged whether or not the determined electric resistance value exceeds a predetermined variation range, for example, whether or not the electric resistance value varies by plus or minus 5% or more with reference to the electric resistance value at the start of the burn-in test.

Process (6): if the judgment represents occurrence of a variation exceeding the predetermined value, for example, a variation of 5% or more, the substrate product BP1 (substrate product BP2) indicative of the varying electric resistance value is recorded as "failed."

Screening on the substrate product BP1 (substrate product BP2) is executed.

With the method of manufacturing the surface-emitting laser according to this embodiment, the above-described burn-in test is executed on the substrate product BP. Electric power may be applied to the surface-emitting lasers 1 in the plurality of device sections DS in the first area A1 of the substrate product BP1 (substrate product BP2) by using the first pad electrode 41 and the second pad electrode 42 in the second areas A2. Also, light emitted by the surface-emitting lasers 1 in the device sections DS may be monitored by using the connection device 2 attached to the substrate product BP1 (substrate product BP2). By using the monitoring results of the dynamic burn-in test for the surface-emitting lasers 1 in the device sections DS, a semiconductor chip including a surface-emitting laser 1 having desirable characteristics may be selected. In the dynamic burn-in test, light emitted by the surface-emitting lasers 1 in the device sections DS is monitored during the burn-in test.

In step S4, after the dynamic burn-in test is completed, the device sections DS of the substrate product BP are separated into semiconductor chips.

Part of or all the first conductor 51, the second conductor 52, and the third conductor 53 remaining at the side edge of the semiconductor chip to be formed may be removed if required. Next, a processing step of removing a metal body is described with reference to FIGS. 11A to 16. The first conductor 51, the second conductor 52, and the third conductor 53 are removed. By the processing step, the first pad electrode 41 and the second pad electrode 42 may be simultaneously removed.

With the manufacturing method according to this embodiment, the conductors (the first conductor 51, the second conductor 52, and the third conductor 53) formed on the substrate product BP for the dynamic burn-in test do not remain on the semiconductor chips of final products.

Specifically, as illustrated in FIGS. 11A to 16, the first conductor 51 is removed from the separation area and the first device section DS1 of the substrate product BP1 (substrate product BP2). The second conductor 52 is removed from the separation area and the second device section DS2. The third conductor 53 is removed from the separation area and the other device sections.

Figures 11A, 11B:
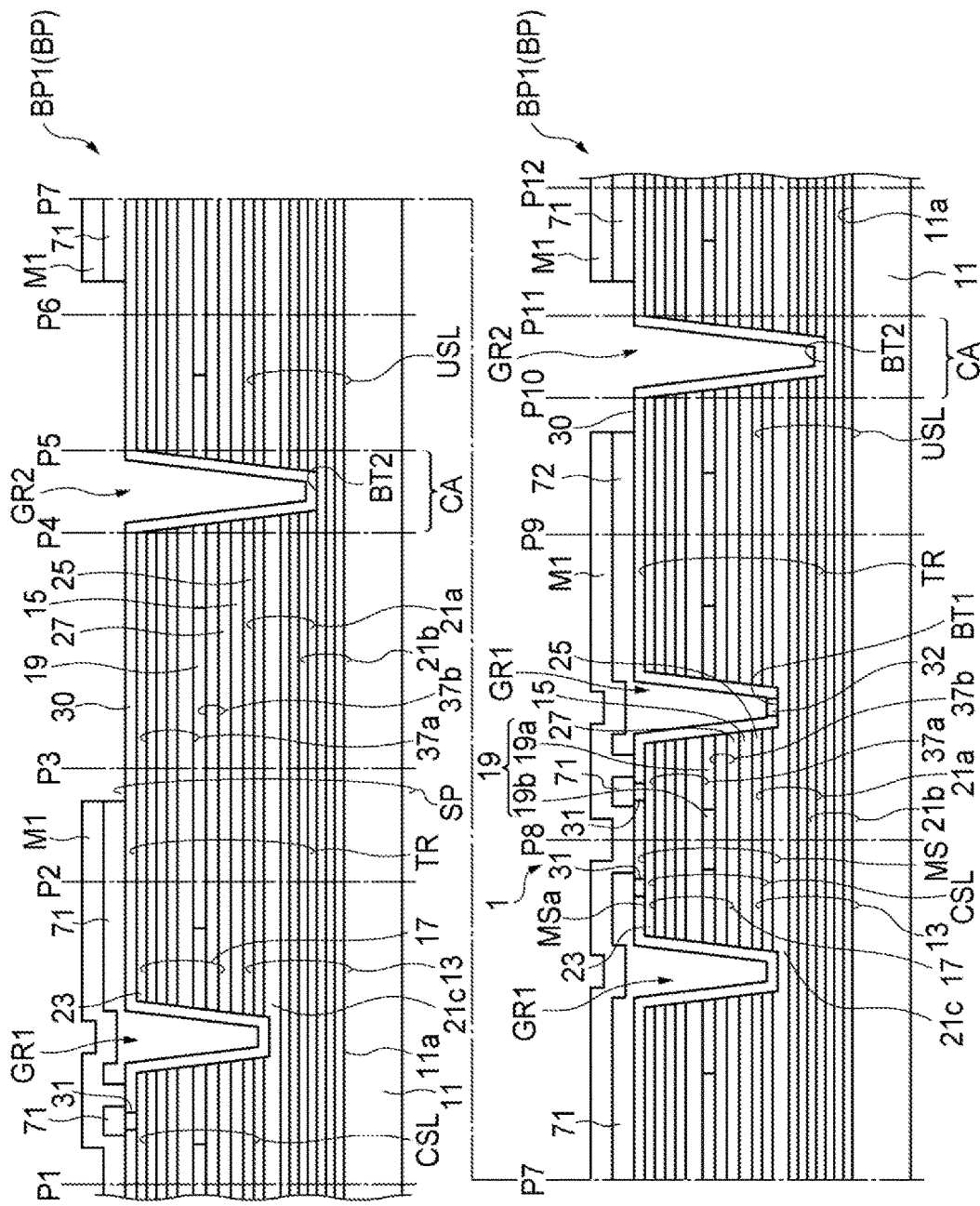
FIGS. 11A and 11B are cross-sectional views taken along line P1-P7 and line P7-P12 illustrated in FIG. 4 and illustrating a parallel-connection substrate product.
Figure 12:
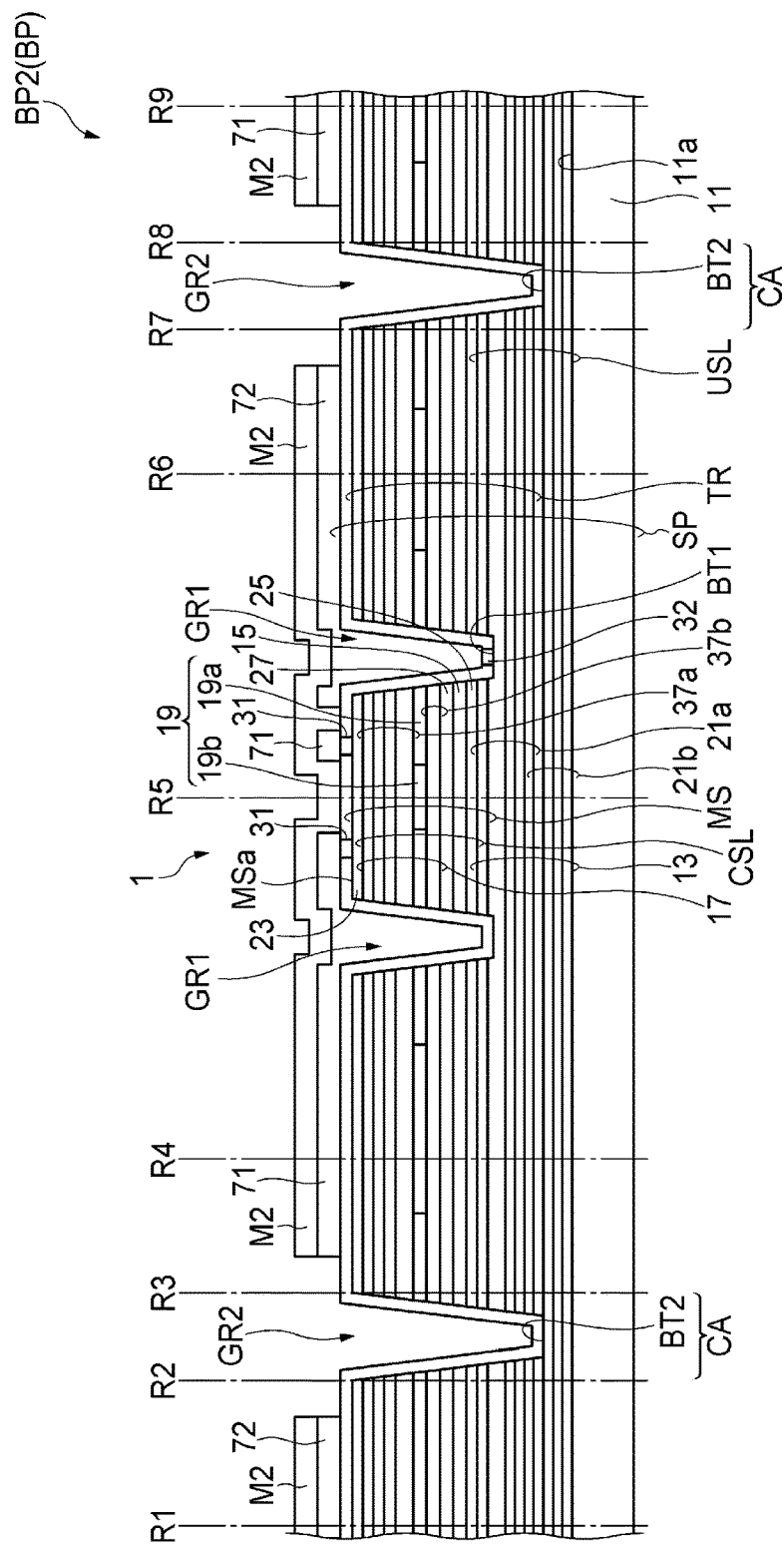
FIG. 12 is a cross-sectional view taken along line R1-R9 illustrated in FIG. 6 and illustrating a series-connection substrate product.

Specifically, the first conductor 51, the second conductor 52, and the third conductor 53 may be removed, for example, by iodine-based wet etching, or ion milling. With this method, as illustrated in FIGS. 11A, 11B, and 12, a mask M1 (mask M2) is formed on the upper surface of the substrate product BP1 (substrate product BP2) by using a photolithography method and an etching method. The mask M1 (mask M2) is made of, for example, a photoresist. The mask M1 (mask M2) has openings above the first conductor 51, the second conductor 52, and the third conductor 53, and covers a device area of the device sections DS (an area other than the laser pad electrodes). After the first conductor 51, the second conductor 52, and the third conductor 53 are removed, the mask M1 (mask M2) is removed.

Figure 13A:
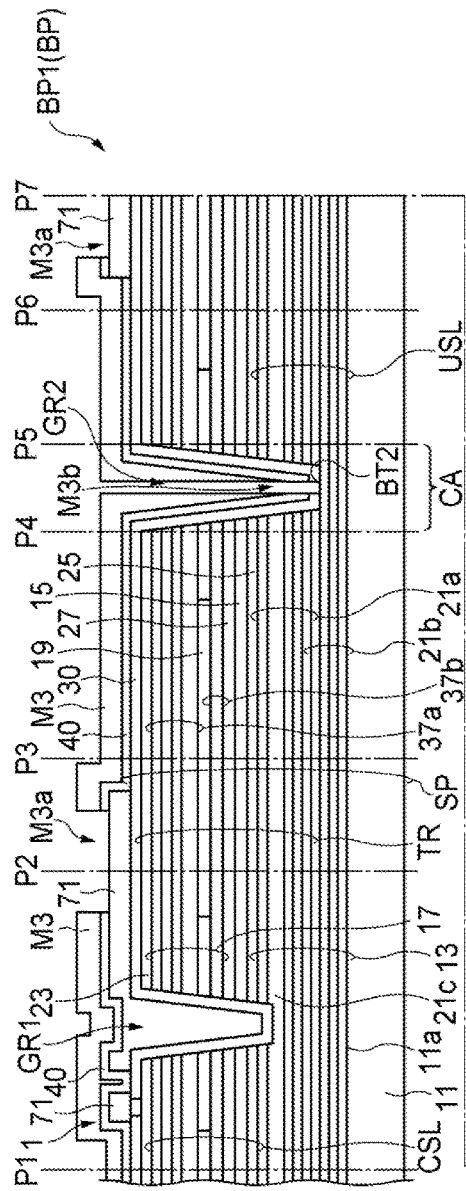
FIGS. 13A and 13B are cross-sectional views taken along line P1-P7 and line P7-P12 illustrated in FIG. 4 and illustrating a parallel-connection substrate product.
Figure 13B:
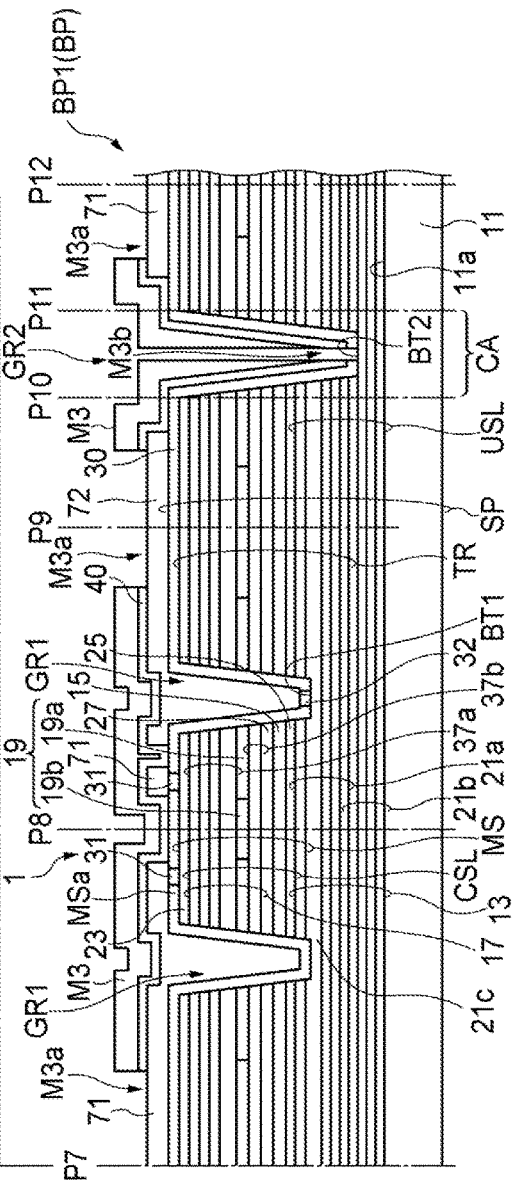
Figure 14:
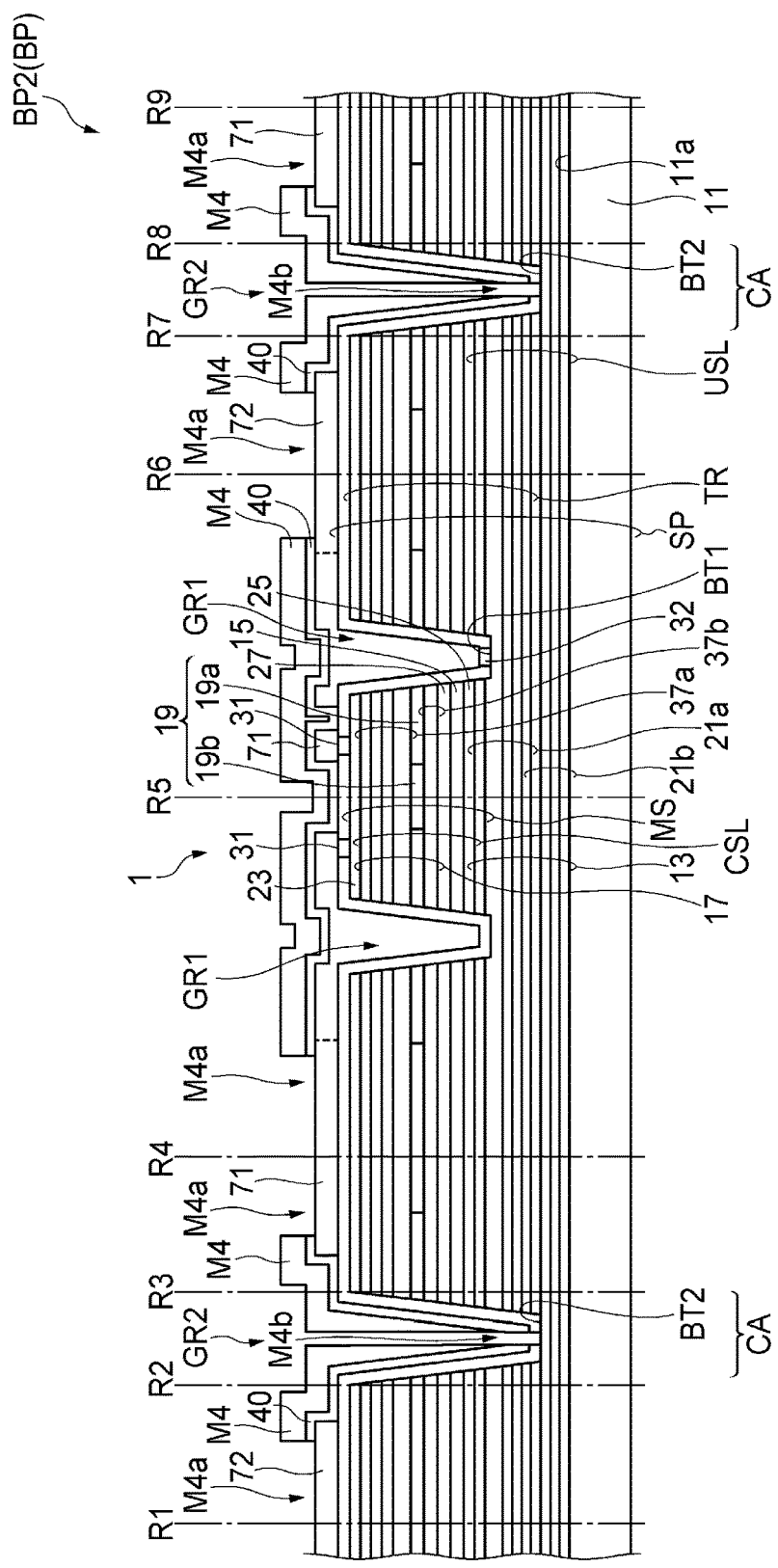
FIG. 14 is a cross-sectional view taken along line R1-R9 illustrated in FIG. 6 and illustrating a series-connection substrate product.

In step S4, after the first conductor 51, the second conductor 52, and the third conductor 53 are removed, as illustrated in FIGS. 13A, 13B, and 14, an insulating layer for forming a passivation film 40 is formed on the substrate product BP1 (substrate product BP2). The insulating layer is formed by, for example, a plasma chemical vapor deposition (CVD) method, and includes a silicon-based inorganic insulator such as silicon nitride (SiN) or silicon oxynitride (SiON). The thickness of the insulating layer to form the passivation film 40 is, for example, in a range from 100 nm to 500 nm on the laser pad electrode.

After the passivation film 40 is formed, as illustrated in FIGS. 13A, 13B, and 14, a mask M3 (mask M4) is formed on the passivation film 40 of the substrate product BP1 (substrate product BP2). The mask M3 (mask M4) has openings M3a and openings M3b (openings M4a and openings M4b). The openings M3a (openings M4a) are located above a pair of electrodes of each of device sections DS, or more specifically, are located above the first laser pad electrode 71 and the second laser pad electrode 72. Each opening M3b (opening M4b) is located at a bottom BT2 of the second groove GR2. The mask M3 (mask M4) is made of a resist, and is formed by using a photolithography method, for example. The insulating layer is etched by using the mask M3 (mask M4). The insulating layer is etched by dry etching using a tetrafluoromethane ($CF_4$) gas or trifluoromethane ($CHF_3$) gas as an etchant, for example.

Figure 15:
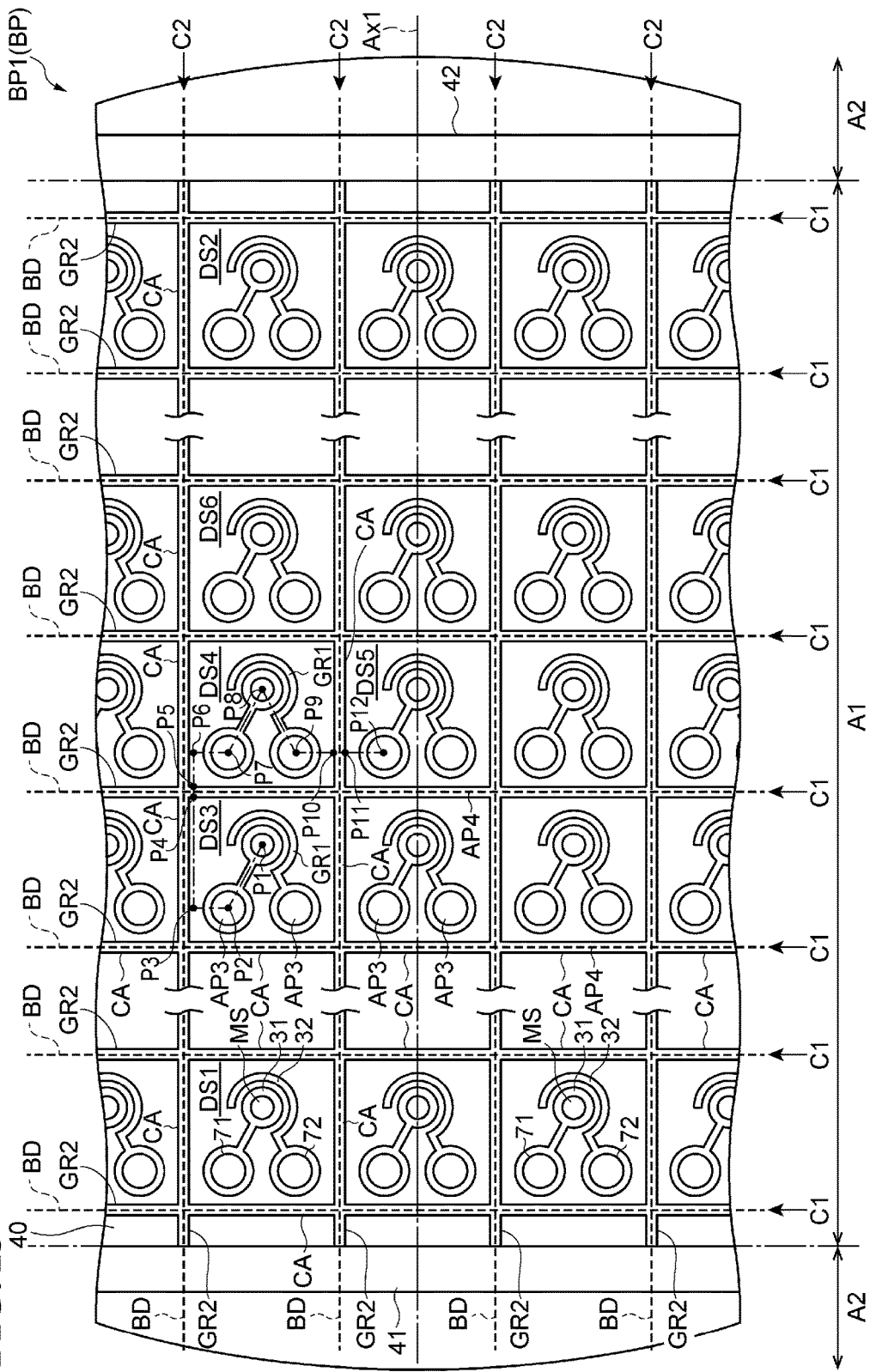
FIG. 15 is a plan view schematically illustrating a parallel-connection substrate product in a step illustrated in FIG. 1 (step of fabricating semiconductor chips).
Figure 16:
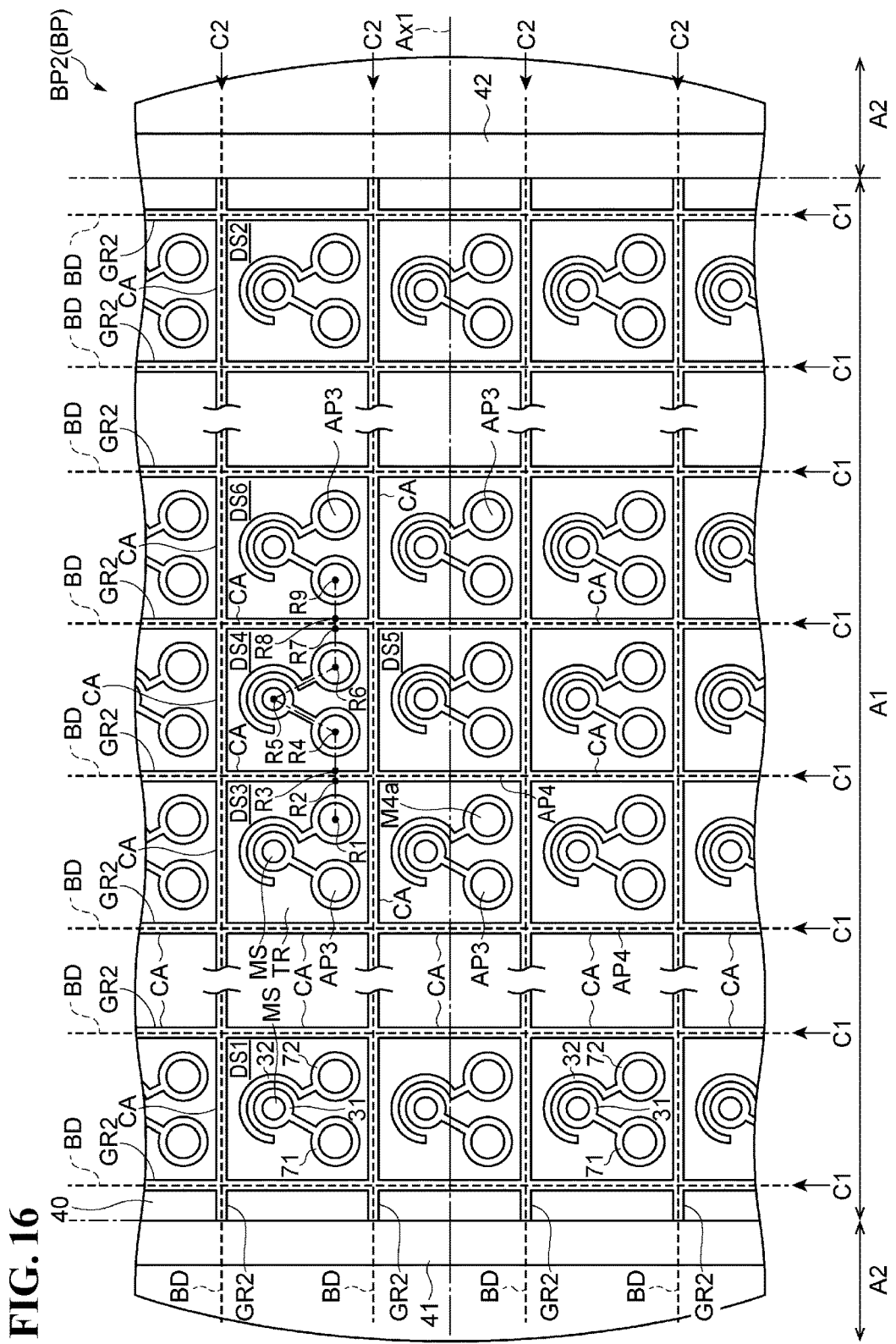
FIG. 16 is a plan view schematically illustrating a series-connection substrate product in the step illustrated in FIG. 1 (step of fabricating semiconductor chips).

As illustrated in FIGS. 15 and 16, in the substrate product BP1 (substrate product BP2), the passivation film 40 located on the first laser pad electrode 71 and the second laser pad electrode 72 is removed by etching at the openings M3a (openings M4a). Third openings AP3 are formed in the passivation film 40 above the first laser pad electrode 71 and the second laser pad electrode 72 at positions corresponding to the openings M3a (openings M4a). Also, both the passivation film 40 and the insulating layer 30 are removed from the bottom BT2 of the second groove GR2 at the opening M3b (opening M4b). A fourth openings AP4 is formed at a position corresponding to the opening M3b (opening M4b). After the openings are formed in the passivation film 40 and the insulating layer 30, the mask M3 (mask M4) is removed.

The substrate product BP1 (substrate product BP2) has the fourth opening AP4 at the bottom BT2 of the second groove GR2. The fourth opening AP4 has a lattice shape. The substrate product BP1 (substrate product BP2) is separated in one direction of lattice openings, and hence semiconductor chips may be fabricated. The substrate product BP1 (substrate product BP2) is divided by using a cutting device, for example, a dicer. Specifically, referring to FIG. 15, in the substrate product BP1, cutting lines C1 extending in the direction intersecting with the first axis Ax1 and cutting lines C2 extending along the first axis Ax1 are illustrated. Referring to FIG. 16, in the substrate product BP2, cutting lines C1 extending in the direction intersecting with the first axis Ax1 and cutting lines C2 extending along the first axis Ax1 are illustrated. By cutting the substrate product BP1 (substrate product BP2) along the cutting lines C1 and C2, semiconductor chips are fabricated. The back surface of the substrate 11 of the substrate product BP1 (substrate product BP2) may be ground so that the substrate 11 has a thickness of about 100 μm if required before cutting the substrate product BP1 (substrate product BP2).

Principles of the present invention have been described with reference to preferred embodiments and drawings. However, those skilled in the art understand that the present invention can be changed in arrangement and in details without departing from the principles. The present invention is not limited to the specific configurations disclosed in the embodiments. Therefore, the claims and all the modifications and changes within the spirit of the claims are claimed as the invention.

What is claimed is:

1. A method of fabricating a surface-emitting laser, the method comprising the steps of:
    fabricating a substrate product having a first area and a second area provided at a side of the first area, the substrate product including a plurality of device sections provided in the first area, a pad electrode provided in the second area, and a conductor, each of the device sections including a surface-emitting laser having an electrode, the conductor connecting the pad electrode to the electrode of the surface-emitting laser across a boundary of the device sections;
    attaching a connection device to the substrate product, the connection device including a probe device, the probe device having a probe and a probe support base supporting the probe, the probe support base having an opening;
    performing a burn-in test of the surface-emitting lasers in the device sections by applying electric power to the pad electrode of the substrate product through the probe that is contacted to the pad electrode at a temperature higher than a room temperature; and
    after the burn-in test of the surface-emitting lasers, separating the substrate product into a plurality of semiconductor chips each of which includes one of the surface-emitting lasers,
    wherein the step of performing the burn-in test includes a step of monitoring light emitted by the surface-emitting laser in at least one of the device sections through the opening of the probe support base during the burn-in test so as to obtain a monitoring result, and a step of selecting the surface-emitting lasers based on the monitoring result.

2. The method of fabricating the surface-emitting laser according to claim 1,
    wherein the connection device includes an optical window and a light receiving device, and
    in the step of performing the burn-in test, the light receiving device is aligned on part of the device sections so as to receive light emitted by at least one of the surface-emitting lasers through the optical window.

3. The method of fabricating the surface-emitting laser according to claim 1,
wherein the substrate product has an insulating layer provided in the first area and the second area, and
the pad electrode is provided on the insulating layer.

4. The method of fabricating the surface-emitting laser according to claim 1,
wherein each of the surface-emitting lasers in the device sections has a pair of electrodes,
the substrate product includes first and second pad electrodes provided in the second area, a first conductor that connects the first pad electrode to one of the pair of electrodes of the surface-emitting laser in a first device section of the device sections across a boundary of the device sections, a second conductor that connects the second pad electrode to one of the pair of electrodes of the surface-emitting laser in a second device section of the device sections across a boundary of the device sections, and a third conductor that connects one of the pair of electrodes of the surface-emitting laser in a third device section of the device sections to one of the pair of electrodes of the surface-emitting laser in a fourth device section of the device sections across a boundary of the device sections.

5. The method of fabricating the surface-emitting laser according to claim 1, further comprising a step of forming a passivation film on the substrate product between the step of performing a burn-in test of the surface-emitting lasers and the step of separating the substrate product into the plurality of semiconductor chips,
wherein the substrate product has an insulating layer provided in the first area and the second area,
the pad electrode is provided on the insulating layer, and
the passivation film has an opening located above the electrode of the surface-emitting laser in each of the device sections.

6. The method of fabricating the surface-emitting laser according to claim 5, further comprising a step of removing the insulating layer and the passivation film from a separation area included in the first area of the substrate product before the step of separating the substrate product into the plurality of semiconductor chips,
wherein the separation area is arranged to surround each of the device sections.

7. The method of fabricating the surface-emitting laser according to claim 1, further comprising a step of removing at least part of the conductor so as to separate the electrode of the surface-emitting laser from the pad electrode between the step of performing a burn-in test of the surface-emitting lasers and the step of separating the substrate product into the plurality of semiconductor chips.

* * * * *